United States Patent [19]

Ushikoshi et al.

[11] Patent Number: 5,306,895
[45] Date of Patent: Apr. 26, 1994

[54] CORROSION-RESISTANT MEMBER FOR CHEMICAL APPARATUS USING HALOGEN SERIES CORROSIVE GAS

[75] Inventors: Ryusuke Ushikoshi, Handa; Kazuhiro Nobori, Haguri; Yusuke Niori, Nagoya; Koichi Umemoto, Toyota; Hiromichi Kobayashi, Yokkaichi; Toshihiko Honda, Nagoya; Kenji Kawabata, Toyonaka, all of Japan

[73] Assignee: NGK Insulators, Ltd., Japan

[21] Appl. No.: 857,968

[22] Filed: Mar. 26, 1992

[30] Foreign Application Priority Data

| Mar. 26, 1991 | [JP] | Japan | 3-84575 |
| May 28, 1991 | [JP] | Japan | 3-150932 |
| Oct. 1, 1991 | [JP] | Japan | 3-253678 |
| Oct. 9, 1991 | [JP] | Japan | 3-262300 |

[51] Int. Cl.⁵ .................................... H01L 21/205
[52] U.S. Cl. ................................. 219/385; 392/416; 219/553; 118/725
[58] Field of Search ............ 219/385, 390, 541, 552, 219/553, 270, 405, 411; 118/50.1, 725, 724, 728; 427/55; 392/416, 418

[56] References Cited

U.S. PATENT DOCUMENTS

| 3,969,696 | 7/1976 | Wolfe et al. | 219/541 |
| 4,357,526 | 11/1982 | Yamamoto et al. | 219/270 |
| 4,555,358 | 11/1985 | Matsushita et al. | 219/553 |
| 4,733,056 | 3/1988 | Kojima et al. | 219/543 |
| 4,771,730 | 9/1988 | Tezuka | 118/723 |
| 4,804,823 | 2/1989 | Okuda et al. | 219/553 |
| 4,897,171 | 1/1990 | Ohmi et al. | |
| 5,119,541 | 6/1992 | Ohmi et al. | 118/725 |
| 5,119,761 | 6/1992 | Nakata | 219/390 |

FOREIGN PATENT DOCUMENTS

| 0254654 | 1/1988 | European Pat. Off. | |
| 58-169788 | 10/1983 | Japan | |
| 59-123181 | 7/1984 | Japan | |
| 59-232994 | 12/1984 | Japan | 118/728 |
| 60-106968 | 6/1985 | Japan | |
| 60-30611 | 9/1985 | Japan | |
| 63-196033 | 8/1988 | Japan | |
| 63-278322 | 11/1988 | Japan | |

OTHER PUBLICATIONS

Patent Abstracts of Japan, vol. 12, No. 398 (C-538)(3245) Oct. 21, 1988 & JP-A-63 140 085 (Kyocera Corp) Jun. 11, 1988.
Patent Abstracts of Japan, vol. 8, No. 247 (E-278)(1684) Nov. 13, 1984 & JP-A-59 124 140 (Fujitsu) Jul. 18, 1984.

Primary Examiner—Bruce A. Reynolds
Assistant Examiner—John A. Jeffery
Attorney, Agent, or Firm—Parkhurst, Wendel & Rossi

[57] ABSTRACT

An excellent corrosion resistant member of a ceramic heater for semiconductor production apparatuses to be exposed to a halogen series corrosive gas is provided. The corrosion resistant member uses one of an aluminum nitride and alumina sintered body as a substrate. A ceramic heater using the corrosion resistive member is also disclosed as well as a semiconductor heating device using the ceramic heater.

23 Claims, 24 Drawing Sheets

FIG._2
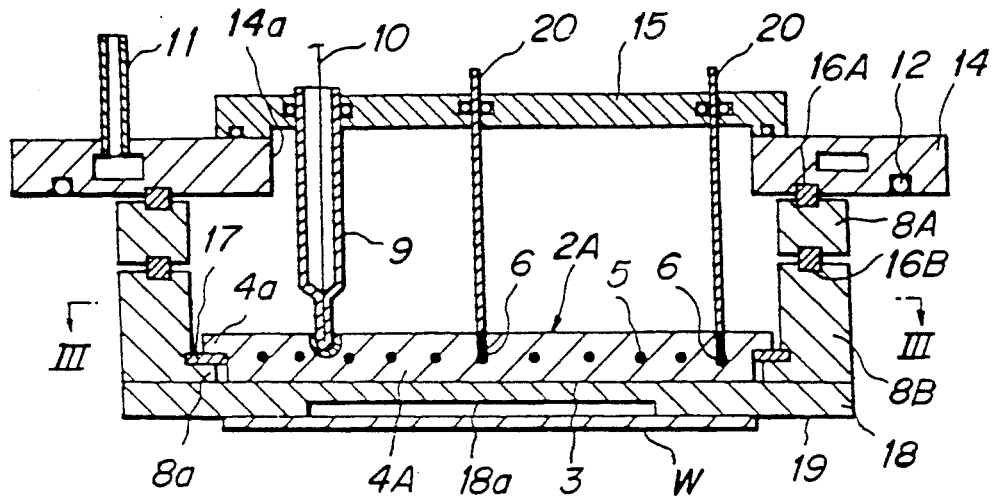
FIG._3
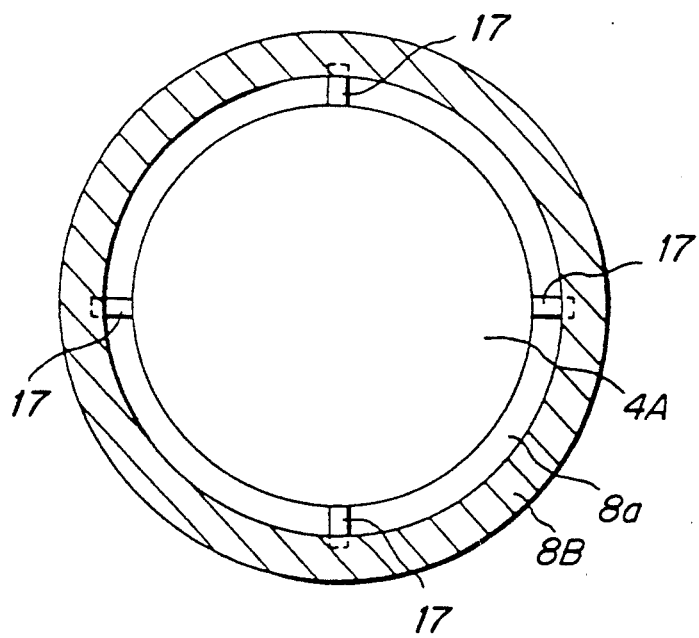

FIG_7
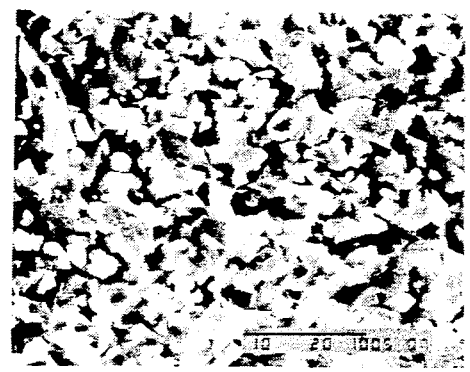
FIG_8
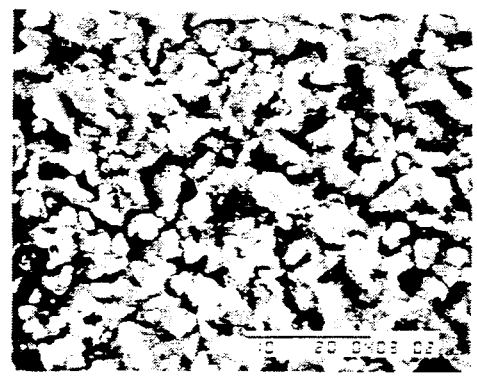

FIG_13
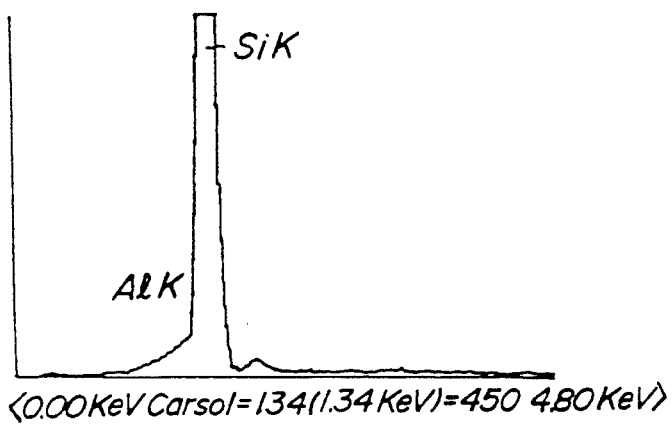
⟨0.00KeV Carsol=134(1.34KeV)=450 4.80KeV⟩
FIG_14
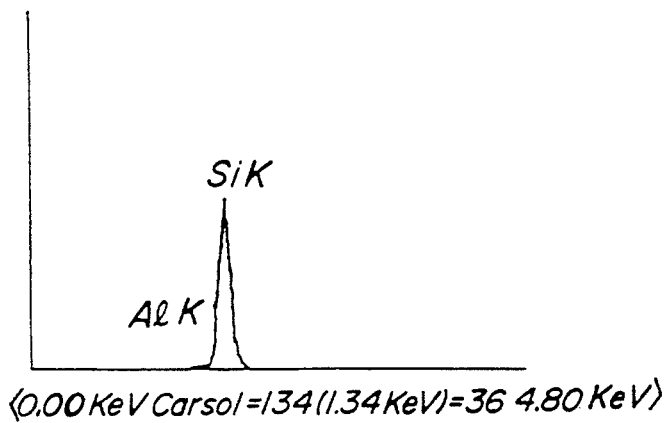
⟨0.00KeV Carsol=134(1.34KeV)=36 4.80KeV⟩

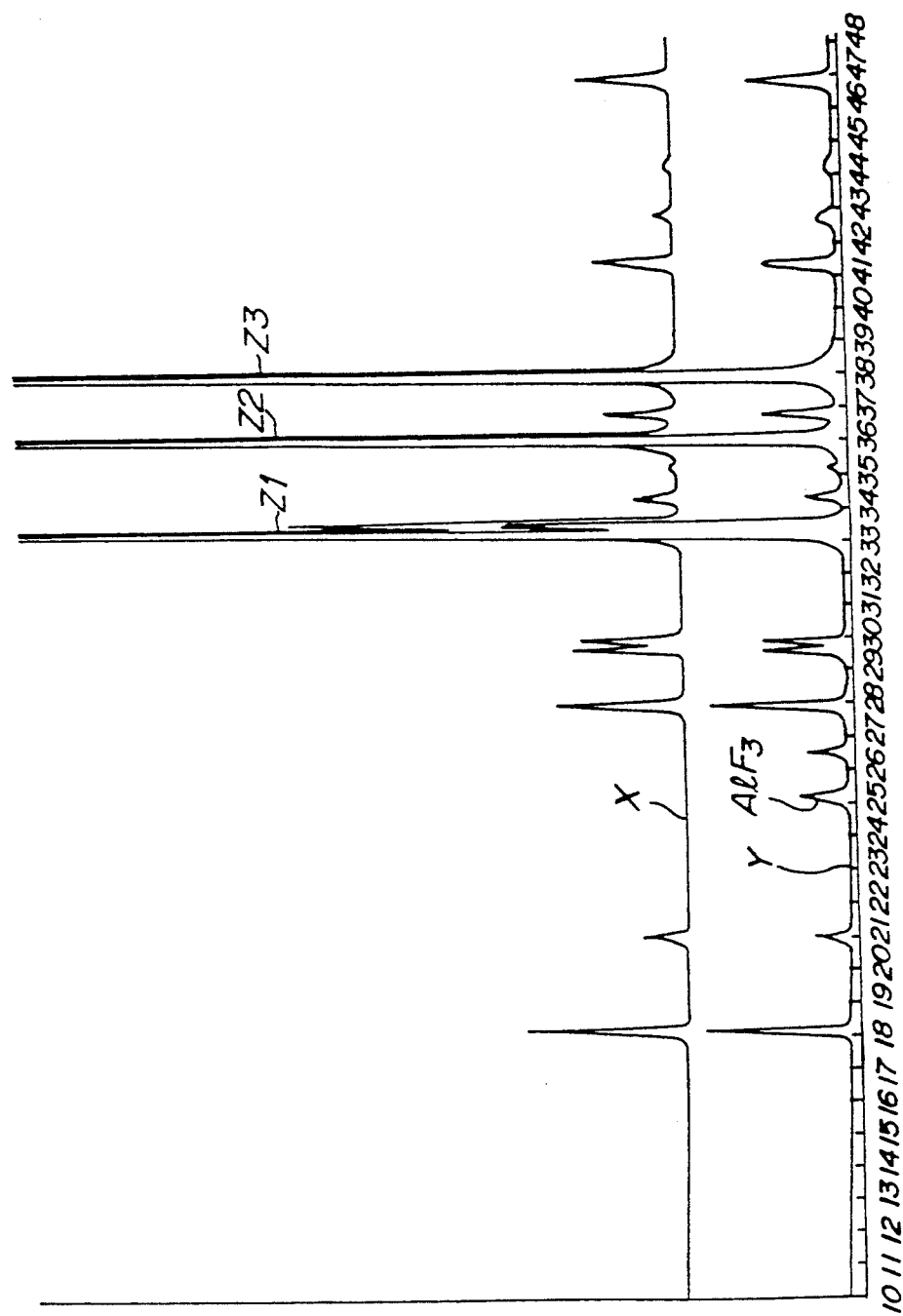

FIG_17
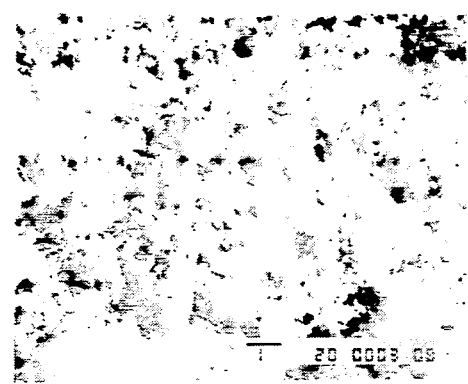
FIG_18
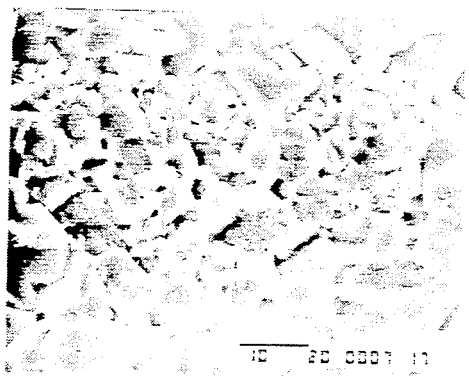

CORROSION-RESISTANT MEMBER FOR CHEMICAL APPARATUS USING HALOGEN SERIES CORROSIVE GAS

BACKGROUND OF THE INVENTION

1. Field of the Invention

The present invention relates to a corrosion-resistant member.

2. Related Art Statement

Heretofore, in the processes of heating semiconductor wafers in semiconductor production apparatuses (for example, by PVD, CVD, diffusion, annealing, etc.), a sheet-by-sheet heating type system has been used wherein the wafers are treated one by one and a batch type heating system has been used, wherein a large number of wafers are treated simultaneously. As heating devices for the former system, use has been made of metallic heaters consisting of a heating resistive body, an insulating material, such as, mica covering the heating body, and a molding metal, such as, stainless steel, inconel, monel, etc., molding the insulating material; graphite heaters consisting of a heat-generating resistive graphite body and boron nitride covering and insulating the graphite body; and heaters of an infra-red radiation system utilizing condensation of light beam emanated from a halogen lamp. As heating devices for the latter system, a means has been adopted of heating a quartz or SiC tube accommodating the wafers by a surrounding heating resistive body.

Accompanying the recent increase of memory capacity of super LSI and progressive development of microprocessing, processes requiring a chemical reaction have been increased. Particularly, in semiconductor production apparatuses necessitating a super clean state, a halogen series corrosive gas, such as, chlorine series gases, or a fluorine series gas, etc., has been used for a deposition gas, an etching gas or a cleaning gas. In the heating systems of heating the wafers in contact with these corrosive gases, e.g. semiconductor production apparatuses, such as, thermal CVD devices, etc., a semiconductor-cleaning gas consisting of halogen series corrosive gas, such as, $ClF_3$, $NF_4$, $CF_4$, HF, or HCl, etc., is used after the deposition stage. In the deposition stage also, a halogen series corrosive gas, such as, $WF_6$, $SiH_2Cl_2$, or monosilane, etc., is used as a deposition gas.

Next, cleaning gases nowadays used in thermal CVD devices, etc., are illustrated in the following Table 1.

TABLE 1

| Item | Cleaning gas | | |
|---|---|---|---|
| | $CF_4$ | $NF_3$ | $ClF_3$ |
| Etching Rate | slow | ordinary | quick |
| Requirement for plasma | yes | yes | no |
| Reactivity at room temperature | no | no | yes |
| Object for etching | Poly-Si | W | SiN,TiN,BN |

Among the cleaning gases shown in the above Table 1, $ClF_3$ has been found to react with a metal at room temperature to form a metal fluoride resulting in corrosion of the metal.

Moreover, corrosion is formed at around 120° C. or a temperature of not less than 300° C., respectively, when stainless steel or inconel is used as the above-mentioned metallic heater, which corrosion forms particles and becomes a cause of deficiency of the semiconductor. Also, boron nitride or silicon carbide is gasified when exposed to a high temperature cleaning gas, and hence becomes a cause of defects of semiconductors due to influence of contamination. Also, when a metallic heater is used in a CVD device, etc., the chamber of the CVD device becomes a high vacuum of $10^{-4}$ Torr at the maximum, so that an efficient heating of wafers is very difficult if a metal of low heat radiation is used and a very long time is required for heating the wafers. Also, a quartz tube has a problem of its devitrification resulting in decrease of the strength thereof.

In order to avoid such problems of corrosion, semiconductor wafers have to be heated to a high temperature for subjecting a film-forming treatment, etc., and thereafter the heater temperature has to be lowered to not more than 300° C. or not more than 100° C. and the above cleaning gas has to be blown to the heater or the like high temperature member to clean the same at such a condition that the film which has to be removed reacts with the cleaning gas but the high temperature member including the heater do not react with the gas. Therefore, a considerably excessive time is required for the cycle of elevation and lowering of the temperature and throughput of the semiconductor at the time of producing the same is decreased. Even when a carbon heater is used for the heating, corrosion occurs at a temperature of higher than room temperature by 150° C. or more to form a powder on the heater surface resulting in formation of particles.

Furthermore, when a halogen series corrosive gas is used as a deposition gas, deposition is effected at a high temperature of 300°-1,100° C., for example, so that the above problem of corrosion can not be avoided.

The inventors studied utilization of a silicon nitride sintered body having a high thermal shock resistant property as a substrate of susceptor or ceramic heater for a semiconductor production apparatus. However, upon further study we have found out that the silicon nitride sintered body is easily corroded by the cleaning gas or the etching gas for the semiconductors.

SUMMARY OF THE INVENTION

An object of the present invention is to provide a corrosion-resistant member having a corrosion-resistant property to halogen series corrosive gases over a broad range of temperatures.

The present invention relates to a corrosion-resistant member to be exposed to a halogen series corrosive gas, which uses an aluminum nitride sintered body as a substrate.

The inventors have made many researches and studies for a corrosion-resistant member having a corrosion-resistant property to halogen series corrosive gases leading to the present invention to find out that aluminum nitride sintered body has an exceedingly superior corrosion-resistant property. Though generally corrosion-resistant ceramics show ion activity to an aqueous acicic, or alkaline solution, the present inventors focused not on ion reactivity but on reactivity of the corrosion-resistant member to redox reactions of gaseous halogen in a dry gas.

Taken $ClF_3$ gas, for example, it generates fluorine radicals by thermal decomposition when heated, which fluorine radicals have an etching function or a cleaning function on various materials. $ClF_3$ dissociates according to the following formula

Though the dissociation of $ClF_3$ molecule is most vigorous at a temperature of 120°–230° C., $ClF_3$ molecule dissociates to a certain extent at room temperature, so that it can be used as a cleaning gas at room temperature. The inventors have now found out that aluminum nitride sintered body is stable at a temperature from room to a high temperature of 1,100° C.

As for $NF_3$ gas, decomposition of $NF_3$ molecules by means of plasma is necessary as shown in Table 1. Because it accompanies decomposition by means of plasma, it can be used as an etching gas or a cleaning gas even at a low temperature of, for example, 30° C., though the etching rate is large at higher temperature. The same applies to $CF_4$ gas.

The inventors have also found out that aluminum nitride is stable even when it is exposed to $NF_3$ gas or $CF_4$ gas at a high temperature of, for example, 300°–1,100° C.

If a corrosion resistant member is placed in a region wherein plasma is generated and F+ and F− radicals are generated at room temperature by application of a high frequency voltage, the temperature of the surface layer of the corrosion resistant member becomes a state of exceeding 200° C. by bombardment of the fluorine radicals to the corrosion-resistant member. The inventors have found out that aluminum nitride sintered body has an effective corrosion-resistant property as well as heat-resistant property even at this state.

The inventors have ascertained that the corrosion-resistant member of the present invention is also hardly corroded, even when it is placed in a dry etcher using $NF_3$ plasma, etc., and exposed to $NF_3$ plasma, etc.

If the present corrosion-resistant member is used for a semiconductor production apparatus, a structural part stable to a cleaning gas or an etching gas can be provided and particles and contamination which are the causes of defects in of semiconductors can be prevented from forming.

By the present corrosion-resistant member, production of highly integrated semiconductors, particularly DRAM, or 4M, etc., can be satisfactorily obtained for the first time.

Moreover, when the corrosion resistant member is expected to be used as a heater for heating semiconductor wafers, the temperature of the heater need not be lowered to, for example, not more than 100° C. each time, at the time of cleaning the heater after formation of the semiconductor wafer films, and the cleaning can be performed while maintaining the heater temperature to not less than 300° C. and not exceeding the film formation temperature. Therefore, throughput of film formation onto the semiconductor wafers can be remarkably increased and the productivity can be noticeably improved. The same advantageous effects can be obtained when the corrosive resistant member is used in an electrostatic chuck (which will be later described, refer to FIG. 4) wherein it is integrally formed with a susceptor a heater, respectively for heating a semiconductor wafer.

Furthermore, if the aluminum nitride sintered body is used as a substrate or a main component of the corrosion-resistant member which is exposed to a film-forming corrosive gas, such as, $WF_6$, etc., at a high temperature of 300°–1,100° C. in a film-forming process, the formation of particles and contamination which are the causes of semiconductor defects can be prevented.

Though the aforementioned cleaning gas and etching gas consisting of a halogen series corrosive gas have been widely used in chemical industries other than the semiconductor production industry, the present invention is effective also to corrosion resistant members in this field. Though halogen series corrosive gases are used in CVD devices for producing high temperature materials, oxidation-resistant materials and super hard materials by providing a coating on a surface of a general ceramic by CVD processes, the present invention is also effective in such cases. Such film-forming reactions are exemplified as follows.

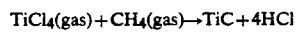

$TiCl_4(gas) + CH_4(gas) \rightarrow TiC + 4HCl$

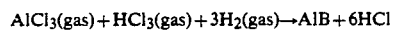

$AlCl_3(gas) + HCl_3(gas) + 3H_2(gas) \rightarrow AlB + 6HCl$

According to the heating device of the present invention, the ceramic heater heats wafers placed in the housing of the heating device directly or via a plate, so that a high heat efficiency can be achieved. Also, the ceramic heater consists of the ceramic substrate having a heating resistive body embedded therein, so that the contamination as in metallic heaters does not occur at all.

Moreover, at least one of the electrode members is enclosed by a tubular body and an end of the tubular body is gastightly joined to the ceramic substrate and the tubular body is also gastightly sealed from the housing, so that if an electrically conductive deposited film is formed on the rear surface of the ceramic heater the deposited film is interrupted by the tubular body to prevent short-circuiting of the electrode member enclosed in the tubular body to another electrode member. Moreover, the danger of discharge or leakage of electric current between the electrode member enclosed in the tubular body and the housing can be prevented. Furthermore, the electrode member enclosed in the tubular body is not exposed to the inner space of the housing, so that the corrosion of the electrode member and the block-shaped terminals and the resultant corrosion of the housing do not occur at all.

Because the temperature measuring device is enclosed by the tubular body made of an inorganic insulative material and an end of the tubular body is joined to the ceramic substrate and the tubular body is gastightly sealed from the housing, a mixed contacting and induction of the semiconductor production apparatus can be prevented even if a high frequency electric power source or a high voltage electric power source is used for the apparatus. Moreover, even if a metal is used for constituting the temperature measuring device, the metal is not exposed to the inner space of the housing, so that corrosion of the temperature measuring device and accompanying contamination of the housing do not occur. Furthermore, the temperature measuring device is separated from the interior atmosphere of the housing by the tubular body, so that measuring values measured by the temperature measuring device are not adversely influenced by pressure fluctuation even if the pressure within the housing is rapidly fluctuated at the time of producing the semiconductors.

BRIEF DESCRIPTION OF THE DRAWINGS

For a better understanding of the present invention, reference is made to accompanying drawings, in which:

FIG. 2 is a schematic cross-sectional view of a disc-shaped ceramic heater provided with a wafer-heating susceptor;

FIG. 3 is a cross-sectional view along the line III—III thereof;

FIG. 7 is a photograph of a sample according to the present invention before the corrosion-resistant test taken by a scanning electron microscope (SEM);

FIG. 8 is a photograph of a sample according to the present invention after the corrosion-resistant test taken by a scanning electron microscope;

FIG. 13 is an EDAX chart of an initial state of a sample of a comparative example;

FIG. 14 is an EDAX chart of a sample of a comparative example after the corrosion test;

FIG. 15 is an X-ray diffraction chart of a sample according to the present invention before and after the corrosion test;

FIG. 17 is a photograph of a surface state of a sample of a comparative example after exposure to $NF_3$ plasma taken by a scanning electron microscope;

FIG. 18 is a photograph of a surface state of a sample according to the present invention after exposure to $NF_3$ plasma taken by a scanning electron microscope;

DESCRIPTION OF THE PREFERRED EMBODIMENTS

Hereinafter, the present invention will be explained in more detail with reference to examples.

EXAMPLE 1

At first, an embodiment of the present invention applied to a disc-shaped ceramic heater will be explained in this example.

Figure 1:
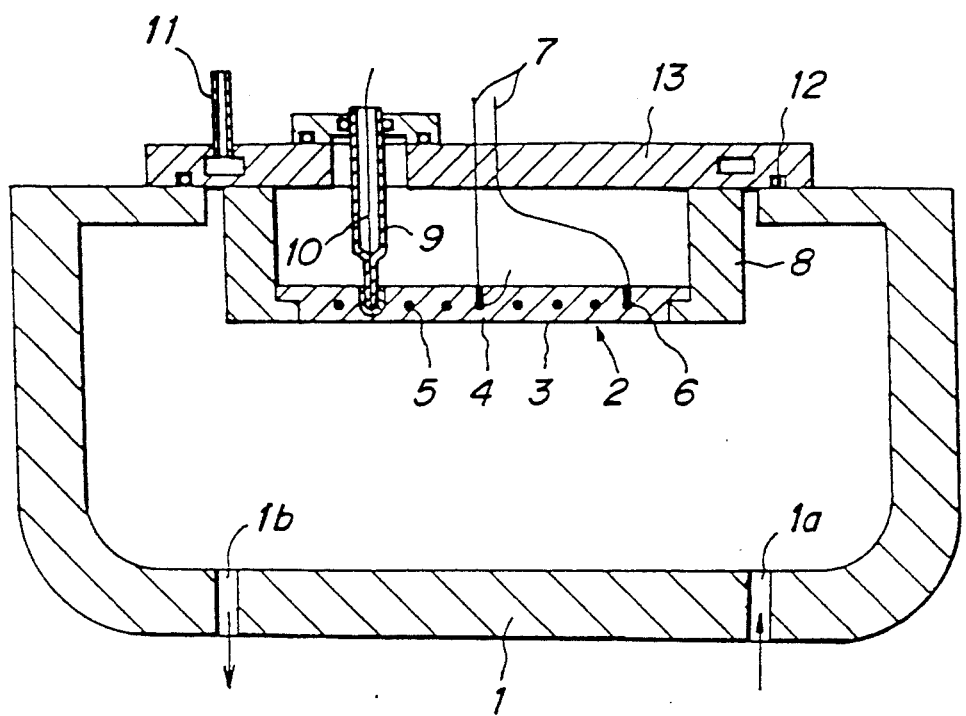
FIG. 1 is a schematic cross-sectional view of a disc-shaped ceramic heater attached to a housing of a CVD device.

Referring to FIG. 1, a state of a ceramic heater is shown which is attached to a sheet-by-sheet type thermal CVD system in a cross-sectional view, wherein reference numeral 1 is a housing used for the thermal CVD for producing semiconductors, reference numeral 2 is a disc-shaped ceramic heater for heating wafers attached to a case 8 interior of the housing 1, and reference numeral 3 is a wafer-heating surface having a size of, for example, 4–8 inch capable of providing wafers thereon.

The housing 1 is supplied therein with a gas for thermal CVD through a gas inlet hole 1a and the inner air is exited through a suction hole 1b by a vacuum pump. The disc-shaped ceramic heater 2 consists of a substrate 4 made of a dense and gastight aluminum nitride having a tungsten series or the like heat-generating resistive body 5 spirally embedded therein. The disc-shaped ceramic heater 2 has electric power supply cables 7 at the center and an end portion which can supply an electric power from the exterior to the ceramic heater 2 to heat the same to a temperature of, e.g., around 1,100° C. at the maximum. Reference numeral 13 is a flange with a water-cooled jacket 11 covering the upper surface of the case 8, and sealed from the side wall of the housing 1 by an O-ring 12 to form a ceiling of the housing 1. Reference 9 is a hollow sheath inserted to the interior of the housing 1 through the wall of the flange 13 of the housing 1 and connected to the ceramic heater 2. The hollow sheath 9 has in its interior a thermocouple 10 having a stainless steel sheath inserted therein. Between the hollow sheath 9 and the flange 13 of the housing 1 is provided an O-ring to prevent invasion of air therein. The heat-generating resistive body 5 has at the both ends electrode terminals 6 which are connected to the electric power supply cables 7.

When using an aluminum nitride sintered body as a substrate of a disc-shaped ceramic heater in this way, a sintering aid is preferably added in order to improve homogeneous heating of the semiconductor wafers. In such a case, addition of an alkaline metal, an alkaline earth metal or a heavy metal should preferably be avoided as far as possible in order to minimize contamination of the semiconductors. Concretely explained, $Al_2O_3$, Si, and C, etc., are nowadays already used in semiconductor production apparatuses and are not elements causing a trouble. However, these elements have a drawback in that they decrease heat conductivity of the semiconductor wafers, so that oxides of rare earth element, Ni compounds, fluorides of rare earth element and fluorides are preferable, and $Y_2O_3$ and $Yb_2O_3$ and $AlF_3$ are particularly preferable as sintering aids.

EXAMPLE 2

Next, an embodiment of the present invention applied to a susceptor for heating wafers provided on a heat-generating surface of a disc-shaped ceramic heater will be explained in this example.

Referring to FIG. 2, a state of a disc-shaped ceramic heater having a susceptor for heating the wafers is shown in a cross-sectional view which is attached to a flange portion of a thermal CVD device, and FIG. 3 is a cross-sectional view thereof taken along the line III—III.

A flange portion 14 is attached to a housing (not shown) of a thermal CVD device for producing semiconductors to constitute a ceiling of the housing. The flange portion 14 and the housing not shown are gastightly sealed from each other by means of an O-ring inserted therebetween. The flange portion 14 has a detachable top plate 15 attached thereto on the upper side thereof covering a round penetration hole 14a of the flange portion 14, and a cold water jacket 11 attached thereto.

The flange portion 14 has at its lower side a ring-shaped case retainer 8A made of graphite, etc., fixed thereto via a heat insulative ring 16A. The case retainer 8A and the flange portion 14 are not directly contacted with each other and have a little gap therebetween. The case retainer 8A has at its lower surface a substantially ring-shaped case 8B made of graphite, etc., fixed thereto via a heat insulative ring 16B. The case 8B and the case retainer 8A are not directly contacted with each other and have a little gap therebetween.

A disc-shaped substrate 4A made of a dense ceramic has in its interior a heating resistive body 5 spirally embedded therein to constitute a disc-shaped ceramic heater 2A. The heat-generating resistive body 5 is connected at its both ends to an electrode terminal 6, respectively. The electrode terminals 6 are embedded in the disc-shaped substrate 4A so as to expose their surfaces on the rear side of the disc-shaped substrate 4A. The pair of electrode terminal 6 is respectively connected to a rod-shaped electrode member 20 and an end of the electrode member 20 is respectively connected to a lead wire.

A hollow sheath 9 made of molybdenum, etc., has a thermocouple 10 with a stainless steel sheath embedded therein and a narrow end of the hollow sheath 9 is connected to a rear side of the disc-shaped substrate 4A. The hollow sheath 9 and a pair of electrode member 20 penetrate respectively a ceiling plate 15 of the housing to protrude the end thereof to the exterior of the housing. The pair of electrode member 20 and the hollow sheath 9 are gastightly sealed by an O-ring from the ceiling plate 15.

The disc-shaped ceramic heater 2A has at its rear circumferential side a ring-shaped extended portion 4a, and the case 8B has at its lower inner circumferential side a ring-shaped extended supporting portion 8a. The disc-shaped ceramic heater 2A and the case 8B are disposed with a certain gap therebetween so as not to contact with each other. Columnar intervening pins 17, for example 4 in number, are interposed between the inner circumferential side of the case 8B and the circumferential side of the ceramic heater 2A, and an end of the intervening pins 17 is fixed on the supporting portion 8a by threading, joining, fitting or mating, etc., and the other end of the pins 17 mounts thereon the extended portion 4a thereby to heat insulate and fix the ceramic heater 2A.

A disc-shaped susceptor 18 for heating semiconductor wafers is fixed on the lower side of the case 8B and a heat-generating surface 3 of the disc-shaped ceramic heater 2A so as to intimately contact therewith. The wafer heating susceptor 18 has a wafer mounting surface 19 at the lower side for heating the wafers. The wafer mounting surface has at its lower side a recess 18a formed in a similar shape to the plane shape of the semiconductor wafer.

In this embodiment, the aforementioned functions and effects of the present invention can be attained by constituting at least the susceptor 18 for heating the wafers from an aluminum nitride sintered body. In this case, a cleaning gas, such as, $ClF_3$ or $NF_3$, etc., impinges upon the wafer-heating susceptor 18 and does not directly impinge upon the heating surface of the ceramic heater 2A, so that the disc-shaped substrate 4A can be made of a dense and gastight ceramic other than aluminum nitride. In this case, the disc-shaped substrate 4 is preferably made of a silicon nitride body having a high thermal shock resistant property.

EXAMPLE 3

A wafer heating susceptor of an infra-red radiation heating system can be made of an aluminum nitride sintered body in the same fashion as described in Example 2. In this heating system, an infra-red radiation lamp is arranged at outside of the housing of the thermal CVD device and an infra-red radiation permeating window is provided on the outer wall of the housing and an infra-red radiation is emitted and impinged upon the wafer heating susceptor through the window to heat semiconductor wafers placed on the surface of the susceptor.

EXAMPLE 4

Figure 4:
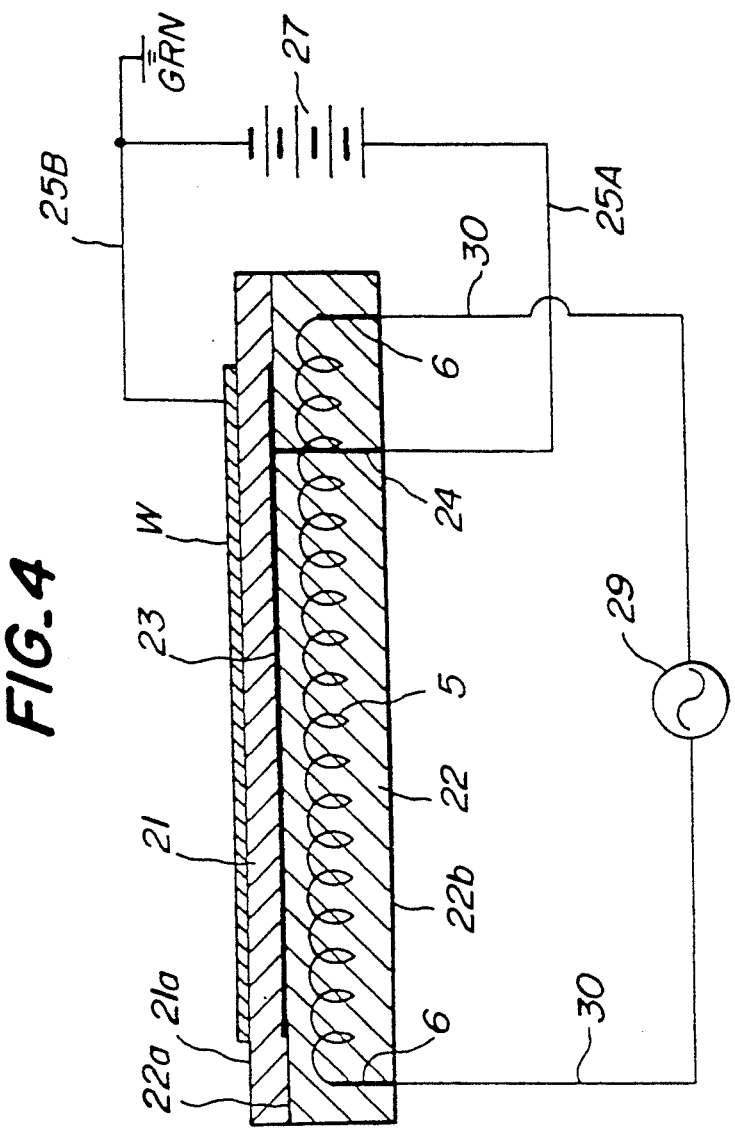
FIG. 4 is a schematic cross-sectional view of an electrostatic chuck integrally formed with a disc-shaped ceramic heater.

Next, an embodiment of the present invention applied to an electrostatic chuck integrally formed with a ceramic heater for adsorbing and heating semiconductor wafers will be explained in this example. The electrostatic chuck having the heater was separately developed by the inventors and is schematically shown in a cross-sectional view in FIG. 4.

A disc-shaped substrate 22 has in its interior a heat-generating resistive body 5 embedded therein in a form of, e.g., spirally wound form. The heat-generating body 5 has at its both ends an electrode terminal 6 respectively connected and fixed thereto, and an end surface of the electrode terminal 6 is respectively connected to an electric power supply cable 30. A pair of electric power supply cable 30 is respectively connected to a heater electric power source 29 and can heat the heat-generating resistive body 5 by operating a not-shown switch. The disc-shaped substrate 22 has opposing main surfaces 22a and 22b. The expression "main surfaces" used herein means surfaces which are relatively broader than the other surfaces.

The disc-shaped substrate 22 has a film-shaped inner electrode 23 of a shape of, e.g., round shape formed along the one main surface 22a. The one main surface 22a has a dielectric layer 21 integrally formed thereon so as to cover the film-shaped inner electrode 23. By this arrangement, the film-shaped inner electrode 23 is accommodated between the disc-shaped substrate 22 and the dielectric layer 21. If the film-shaped inner electrode 23 has a perforated shape like a punching metal, it can exhibit an improved coherent property to the substrate 22 of the dielectric layer 21. The disc-shaped substrate 22 has in its interior an electrode terminal 24 embedded therein, and an end of the electrode terminal 24 is connected to the film-shaped inner electrode 23 and the other end of the electrode terminal 24 is connected to an electric power supply cable 25A. The electric power supply cable 25A is connected to the positive electrode of an electric power source 27 of the electrostatic chuck, and the negative electrode of the power source 27 is connected to an earth line 25B.

When heat treating a wafer W, the wafer W is placed on a wafer-mounting surface 21a of the dielectric layer 21 and the earth line 25B is contacted with the wafer W. The film-shaped inner electrode 23 is accumulated with a positive charge to polarize the dielectric layer 21 so as to accumulate a positive charge on the wafer-mounting surface 21a of the dielectric layer 21. Simultaneously, the wafer W is accumulated with a negative charge, so that the wafer W is adsorbed on the wafer-mounting surface 21a by Coulomb's attractive force between the dielectric layer 21 and the wafer W. Simultaneously, the heating resistive body 5 is activated to heat the wafer-mounting surface 21a to a desired temperature.

According to such an electrostatic chuck equipped with a heater, the wafer W can be heated by heating the wafer-mounting surface 21a, while simultaneously adsorbing and attracting the wafer W on the wafer-mounting surface 21a by Coulomb's attracting force. Therefore, particularly in a high or medium vacuum, the wafer W can quickly follow the heater temperature over the entire surface of the wafer W to enable uniform heating thereof by minimizing the gap between the wafer W and the wafer-mounting surface 21a. Moreover, in such a case, a time required for stabilizing a requisite wafer heating temperature after placing the wafer on the wafer-mounting surface 21a can be minimized, so that production efficiency and throughput of the semiconductor can be improved.

Moreover, by constituting both the dielectric layer 21 and the disc-shaped substrate 22 from aluminum nitride sintered bodies, the corrosion of the electrostatic chuck can be prevented as described above, even when it is exposed to a cleaning gas under a heat-generating state of the heat-generating resistive body 5.

EXAMPLE 5

Next, an embodiment of the present invention applied to a so-called electrostatic chuck which pertains a semiconductor wafer in the interior of a thermal CVD device, etc., will be explained in this example.

Figure 5:
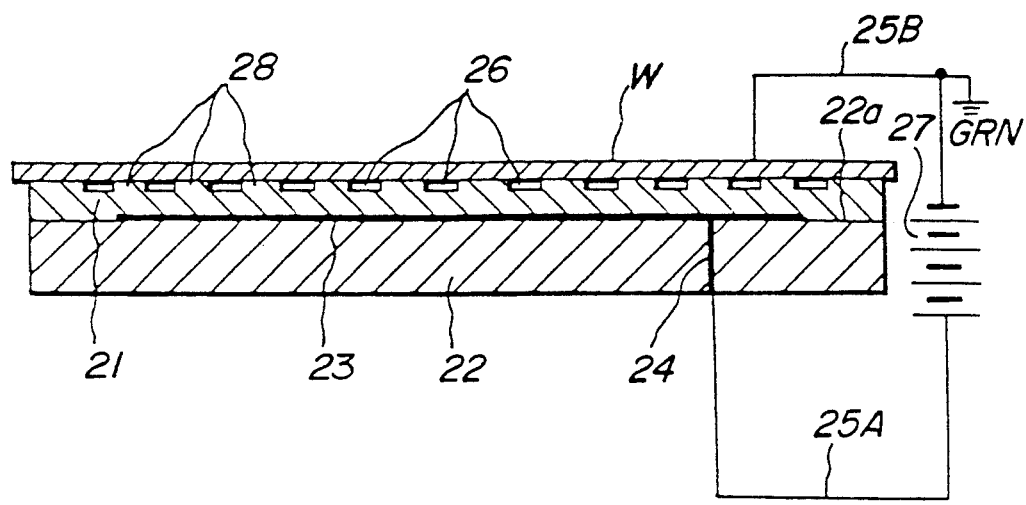
FIG. 5 is a schematic cross-sectional view of an embodiment of an electrostatic chuck.

Referring to FIG. 5, an embodiment of an electrostatic chuck is shown in a schematic cross-sectional view.

An electrostatic chuck was constructed in the same fashion as in Example 4.

Then, a semiconductor wafer W is placed and adhered on a wafer-mounting surface of the dielectric layer 21 of the electrostatic chuck.

Figure 6:
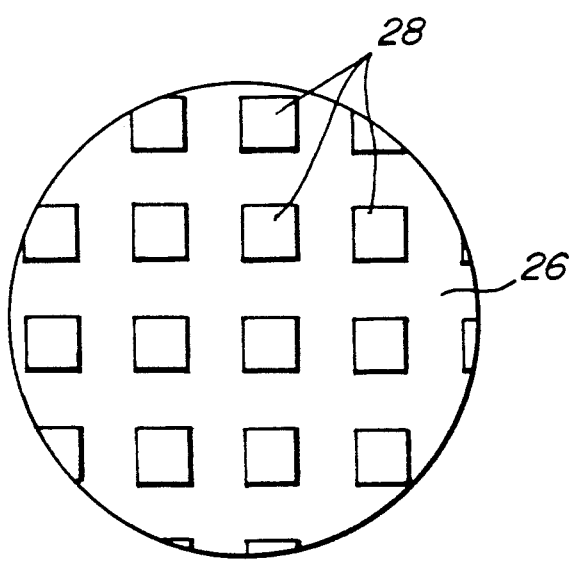
FIG. 6 is a partial enlarged view of a surface of the electrostatic chuck of FIG. 5 for providing a wafer.

The wafer-mounting surface is shown in FIG. 5 and in a partially enlarged plan view in FIG. 6. Protrusions 28 of a substantially square shape in plan view are formed on the wafer-mounting surface in horizontal and lateral directions at a determined spacing in a lattice-like fashion and recesses 26 are formed in the regions between the protrusions 28. By the provision of the recesses 26, a residual adsorbing power of the wafer-mounting surface remaining after deactuation of the electrostatic chuck can be decreased and a response property of the wafer-mounting surface at the time of elevating the temperature of the semiconductor wafer W can be increased.

According to the present invention, a pusher pin for fixing the semiconductor wafer, a hollow sheath tube for accommodating a thermocouple therein, a gas-supply nozzle and a gas exit port for semiconductors in a CVD or PVD device, and the inner wall of the housing (chamber) of a CVD or PVD device can be respectively made of an aluminum nitride sintered body.

EXAMPLE 6

Next, experimental results will be explained concretely in this example.

Each sample as shown in the following Table 2 was respectively sealed in a reaction vessel and air-purged from 760 Torr to $5 \times 10^{-1}$ Torr. Subsequently, substitution the air by $N_2$ gas was effected three times at a pressure of between $5 \times 10^{-1}$ Torr and 500 Torr, and then $ClF_3$ gas was introduced to elevate the reaction vessel pressure from $5 \times 10^{-1}$ Torr to 200 Torr. The gas consisted of 100% of $ClF_3$ and introduced in the vessel at a rate of 100 SCCM. Subsequently, $ClF_3$ gas purge was effected to lower the reaction vessel pressure from 200 Torr to $5 \times 10^{-1}$ Torr, and $N_2$ gas substitution was effected three times at a pressure of between $5 \times 10^{-1}$ Torr and 500 Torr. Thereafter, the sample was taken out from the reaction vessel.

Temperature in the reaction vessel was 241° C. for Run 1, 437° C. for Run 2, and 591° C. for Run 3. Each sample before and after the reaction was weighed and change of the surface state of the samples after exposure to the $ClF_3$ gas was observed by naked eye, SEM and EDAX. Weight change ratio was calculated from the following formula:

$$\frac{(\text{Weight after reaction} - \text{Weight before reaction})}{\text{Weight before reaction}} \times 100(\%)$$

The results are shown in the following Table 2.

TABLE 2

| Run No. | Sample | Sample No. | ClF3 concentration (%) | Temperature (°C.) | Time (hr) | Pressure (Torr) | Weight change ratio (%) | Etching rate (Å) | Surface state Naked eye | SEM | EDAX |
| --- | --- | --- | --- | --- | --- | --- | --- | --- | --- | --- | --- |
| Run 1 | Al₂O₃/SiC | 1-1 | 100 | 241 | 1 | 200 | −0.02 | 1530 | No change ◯ | ◯ | — |
| Run 2 | | 1-2 | | 437 | | | −3.68 | 21700 | Changed white ◯ | Δ | — |
| Run 3 | | 1-3 | | 591 | | | −4.78 | 352000 | Changed white or brown Δ | Δ | — |
| Run 1 | α-SiC | 2-1 | 100 | 241 | 1 | 200 | −0.02 | 1483 | No change ◯ | ◯ | ◯ |
| Run 2 | | 2-2 | | 437 | | | −6.25 | 469000 | Portionally powder X | X | X |
| Run 3 | | 2-3 | | 591 | | | −78.71 | 5890000 | Mostly powder X | X*1 | X |
| Run 1 | β-SiC | 3-1 | 100 | 241 | 1 | 200 | −0.03 | 1797 | No change ◯ | ◯ | ◯ |
| Run 2 | | 3-2 | | 437 | | | −3.99 | 275000 | Portionally powder X | X | X |
| Run 3 | | 3-3 | | 591 | | | −46.16 | 3200000 | Mostly powder X | X | X |
| Run 1 | Aluminum nitride sintered body | 4-1 | 100 | 241 | 1 | 200 | 0.00 | 0 | No change ◯ | ◯ | ◯ |
| Run 2 | | 4-2 | | 437 | | | 0.00 | 0 | No change ◯ | ◯ | ◯ |
| Run 3 | | 4-3 | | 591 | | | 0.01 | 634 | No change ◯ | ◯*2 | ◯ |
| Run 1 | Sialon Si₂N₄ + Y + Al + O | 5-1 | 100 | 241 | 1 | 200 | −0.06 | 44700 | Changed white X | X | X |
| Run 2 | | 5-2 | | 437 | | | −29.29 | 2150000 | Changed white X | X | X |
| Run 3 | | 5-3 | | 591 | | | −41.96 | 3100000 | Portionally powder changed white X | X | X |
| Run 1 | Carbon | 6-1 | 100 | 241 | 1 | 200 | 0.05 | Weight increased | No change ◯ | X | — |
| Run 2 | | 6-2 | | 437 | | | 3.27 | Weight increased | Portionally powder Δ | X | — |
| Run 3 | | 6-3 | | 591 | | | −1.19 | 613000 | Portionally powder X | X | — |
| Run 3 | Al₂O₃ | 7-1 | 100 | 591 | 1 | 200 | 0.01 | Weight increased | No change ◯ | ◯ | — |
| | | 7-2 | | | | | 0.01 | Weight increased | No change ◯ | ◯ | — |

As seen from the results of the above Table 2, aluminum nitride sintered body has a surprisingly high corrosion resistant property to the corrosive ClF₃ gas and no particle was formed which is a cause of the defects of the semiconductor. In this respect, aluminum nitride sintered body is exceedingly effective as a substrate of a high temperature member for semiconductor production apparatuses.

Among the results of the corrosion resistance tests of α-SiC and aluminum nitride sintered body, the results of SEM photograph and EDAX are particularly shown in FIGS. 7–14 wherein Sample Nos. 2-3 and 4-3 are used as typical examples.

SEM photograph of Sample No. 4-3 before and after (*2 of Table 2) the corrosion test is shown in FIGS. 7 and 8. AlN grains in FIG. 8 had a more round shape than those in FIG. 7 and had a reaction product on the surface. The reaction product was identified as aluminum trifluoride by the results of the later described analysis. It is considered that the aluminum trifluoride formed on the surface of AlN grains functions as a barrier to prevent a further progress of the corrosion. These are novel findings found out by the inventors and microstructurally show the corrosion-resistant function of aluminum nitride to a halogen series corrosive gas.

Figure 9:
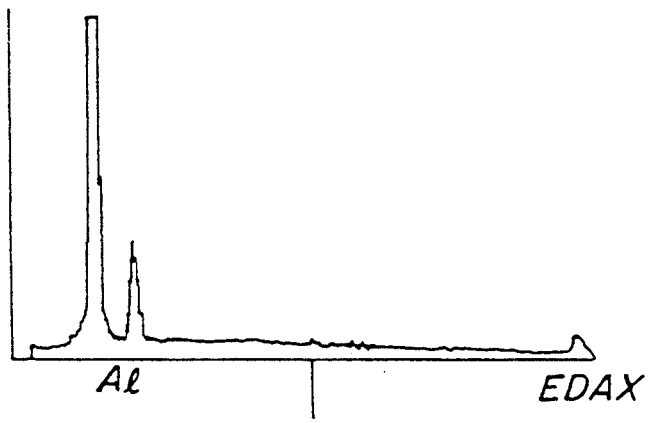
FIG. 9 is an EDAX chart of an initial state of a sample according to the present invention.
Figure 10:
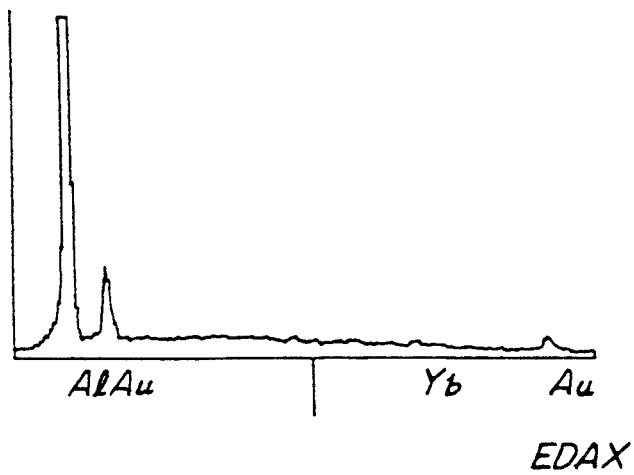
FIG. 10 is an EDAX chart of a sample according to the present invention after the corrosion test.

An EDAX chart of an initial state of Sample No. 4-3 is shown in FIG. 9, and an EDAX chart of the Sample No. 4-3 after the corrosion test is shown in FIG. 10. It can be seen that no-significant difference occurred.

Figure 11:
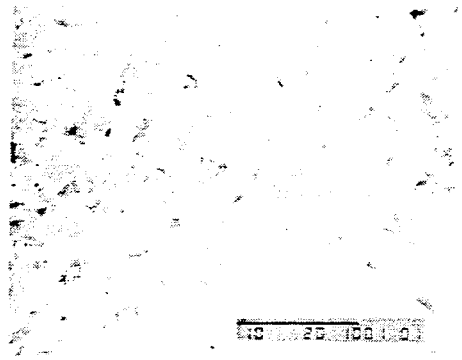
FIG. 11 is a photograph of a sample of a comparative example before the corrosion test taken by a scanning electron microscope.
Figure 12:
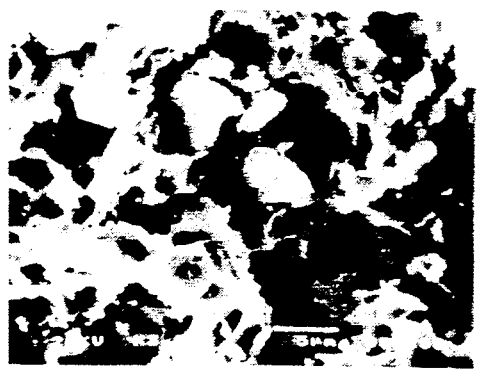
FIG. 12 is a photograph of a sample of a comparative example after the corrosion test taken by a scanning electron microscope.

A SEM photograph of Sample No. 3-2 before the corrosion test is shown in FIG. 11 wherein a smooth surface state of very few undulations can be seen well. A SEM photograph of the same sample after the corrosion test (*1 of Table 2) is shown in FIG. 12. It can be seen that SiC per se was thoroughly corroded by ClF₃ and evaporated to assume a porous microstructure by the corrosion test.

An EDAX chart of Sample No. 2-3 of an initial state is shown in FIG. 15, and an EDAX chart of Sample No. 2-4 after the corrosion test is shown in FIG. 14. It can be seen that the peak of silicon was noticeably decreased showing the progress of the corrosion.

An X-ray diffraction chart of Sample No. 4-3 is shown in FIG. 15 wherein the ordinate represents strength of peak and the abscissa represents diffraction angle (2θ). In FIG. 15, chart X is an X-ray diffraction chart of an initial state of Sample No. 4-3 before the corrosion test, chart Y is an X-ray diffraction chart of the same sample after the corrosion test. A peak Z1 at a diffraction angle 2θ of around 33°, a peak Z2 at a diffraction angle 2θ of around 36°, a peak Z3 at a diffraction angle 2θ of around 38°, are peaks of AlN (hexagonal). Generally, AlF₃ has been known to have a diffraction angle 2θ at 25.3°. By comparing the diffraction charts X and Y before and after the corrosion test with each other, a peak of AlF₃ is clearly seen at 25.3° in the diffraction chart Y after the corrosion test.

Figure 16:
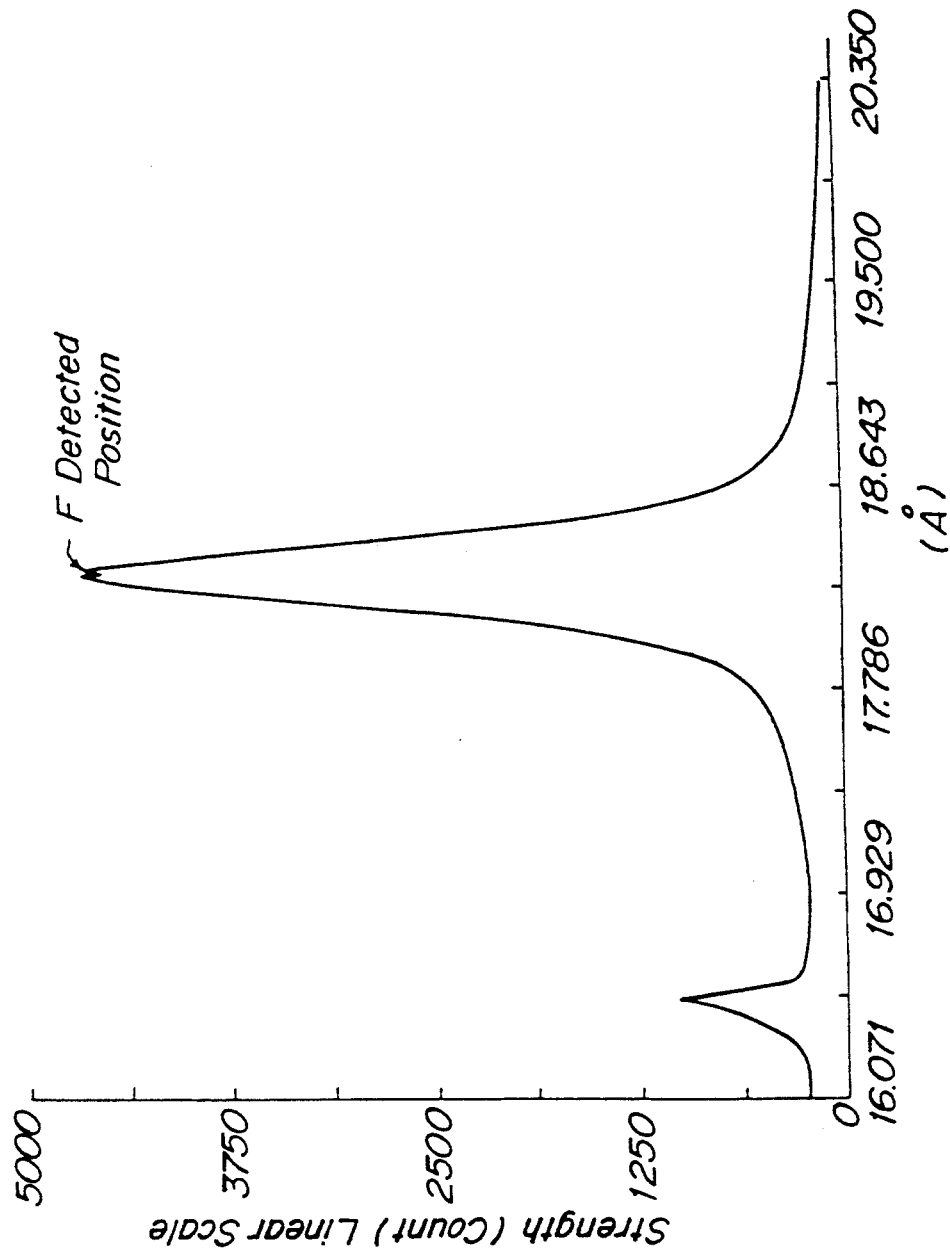
FIG. 16 is an EDAX chart of a sample according to the present invention after the corrosion test.

An EPMA chart of Sample No. 4-3 after the corrosion test is shown in FIG. 16, wherein the ordinate represents strength of peak and the abscissa represents wavelength. Detection point of F(Kα) is at a wavelength of 18.32 Å. From the result of the EPMA analysis, the presence of F peak was detected which of course supports the presence of the aforementioned AlF₃ compound.

EXAMPLE 7

Experiments as to corrosion-resistant metals, etc., will be explained in this example.

As materials exhibiting an effect of highly corrosion-resistant property, there are nickel, monel, stainless steel, and aluminum, etc., among metals. However, their use is restricted to around 300° C. at the maximum, and they required a considerably long time in elevating their temperature as described above, if they are used as a heater for heating semiconductor wafers. If a ceramic is to be used as such a highly corrosion resistant material, alumina exhibited a good corrosion resistant property in a same mechanism with the aluminum nitride sintered body, however, it was not suited to high temperature members, such as, heater, etc., for the sake of a low thermal shock resistant property and a low heat conductivity.

photograph of the surface of Samples A and E taken by a scanning electron microscope is respectively shown in FIGS. 17 and 18.

TABLE 3

| | A | B | C | D | E |
|---|---|---|---|---|---|
| Material of Sample | $Si_3N_4$ | $Si_3N_4$ | AlN ($Yb_2O_3$) | AlN ($Yb_2O_3$) | AlN ($Y_2O_3$) |
| Kind of gas flow rate | $NF_3$/Ar 200 SCCM/ 100 SCCM | $NF_3$/Ar 200 SCCM/ 200 SCCM | $NF_3$/Ar 200 SCCM/100 SCCM | $NF_3$/Ar 200 SCCM/200 SCCM | $NF_3$/Ar 200 SCCM/200 SCCM |
| High frequency powder | 350 W/13.56 MHz | 350 W/13.56 MHz | 500 W/13.56 MHz | 350 W/13.56 MHz | 350 W/13.56 MHz |
| Pressure | 200 mmTorr | 150 mmTorr | 200 mmTorr | 150 mmTorr | 150 mmTorr |
| Procesing time | 15 min | 60 min | 60 min | 60 min | 60 min |
| Temperature | room temperature | room temperature | 680° C. (before experiment) 220° C. (after experiment) | room temperature | room temperature |
| Weight change | 0.0003 g | 0.0689 g | — | 0.00000 g | 0.0001 g |
| Etching rate | 12963 Å/hr | 97590 Å/hr | — | 0 Å/hr | 0 Å/hr |
| Observation by naked eye | particle formed | particle formed | not changed | not changed | not changed |
| EDAX | Si peak decreased | Si peak decreased | not changed | not changed | not changed |
| X-ray diffratcion | — | — | $AlF_3$ protective film formed | $AlF_3$ protective film formed | $AlF_3$ protective film formed |

EXAMPLE 8

Film forming experiment of $WSi_x$ will be explained in this example.

When forming a film of $WSi_x$, $WF_6$ and $SiH_2Cl_2$ are used as deposition gases. In this case, Cl in the $SiH_2Cl_2$ gas causes etching of various members in the deposition operation. In cleaning operation after the formation of film, $NF_3$ plasma is used as a cleaning gas, and F in $NF_3$ causes etching of various members by radical reactions. However, if a corrosion resistant member produced from aluminum nitride sintered body is used for forming a film of $WSi_x$ on an Si wafer, particles and contamination did not form at all which cause defects of semiconductors.

EXAMPLE 9

Evaluation of corrosion-resistant property to $NF_3$ gas will be explained in this example.

Samples A, B, C, D and E as shown in the following Table 3 were prepared and exposed to plasma of $NF_3$ gas to perform corrosion resistant tests.

Sample A was a flat plate of silicon nitride sintered body of a length of 10 mm, a width of 10 mm and a thickness of 2 mm. Sample B was a disc of silicon nitride sintered body of a diameter of 50 mm and a thickness of 1 mm. Samples C and D were aluminum nitride using ytterbium oxide as a sintering aid. Sample E was aluminum nitride using yttria as a sintering aid. Sample C was a flat plate of a shape of a length of 10 mm, a width of 10 mm, and a thickness of 2 mm. Samples D and E were flat plates of a shape of a length of 10 mm, a width of 10 mm, and a thickness of 1 mm. A gas of a kind as shown in Table 3 was flowed at a flow rate as shown in Table 3, and a high frequency power was applied to form a plasma state to etch respective samples for 15 or 60 min. Temperature condition was room for Samples A, B, D and E, and temperature was decreased from 680° C. to 220° C. for Sample C.

The samples A, B, D and E were measured on weight change and etching rate before and after the experiment. Surface states of the samples after the etching treatment were measured by naked eye, EDAX and X-ray diffraction. The results are shown in Table 3. A As seen from the above Table 3, the samples A and B which are outside the scope of the present invention show a large weight change and a large etching rate and formation of particles on the surface. Also, a peak of silicon decreased noticeably in an EDAX chart, showing the progress of the corrosion. A photograph of the Sample A taken by SEM showed corrosion of $Si_3N_4$ per se.

The samples C, D and E which are within the scope of the present invention did not show corrosion thereof. No change was seen in EDAX chart before and after the experiment. The sample E was seen as if it has a fluoride of aluminum formed on the surface from a photograph taken by SEM.

As described above, according to the present invention, corrosion-resistant ceramic members having an exceedingly high corrosion resistant property over a broad temperature range can be provided by using an aluminum nitride sinterebody as a substrate of a corrosion-resistant member which is to be exposed to a halogen series corrosive gas.

EXAMPLE 10

A preferred embodiment of a ceramic heater will be explained in this example.

At first, the whole structure of the ceramic heater according to this embodiment will be explained.

Figure 24:
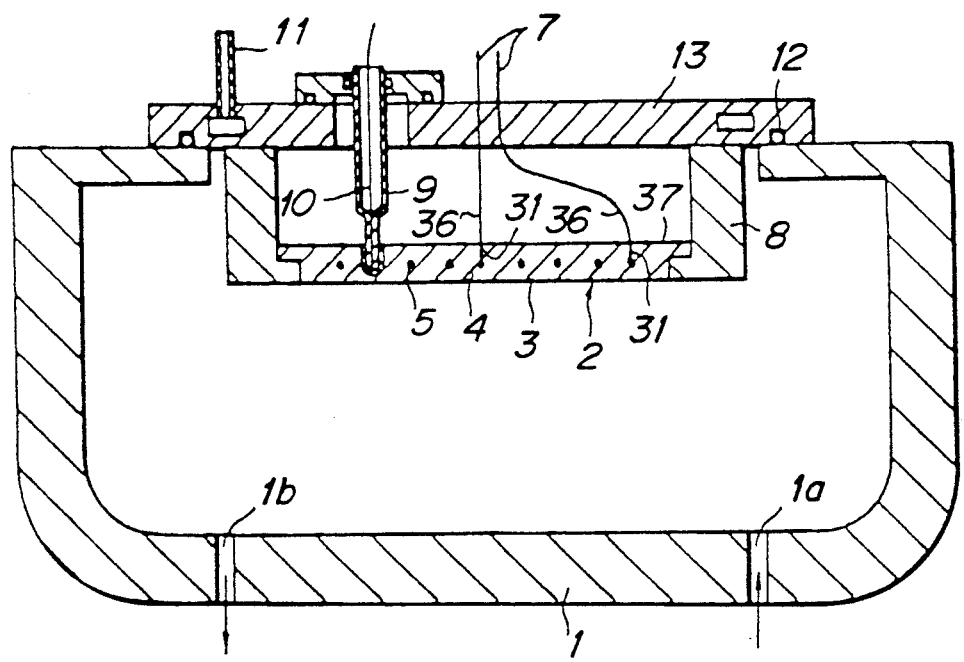
FIG. 24 is a schematic cross-sectional view of a ceramic heater 2 attached to a housing of a thermal CVD device.

Referring to FIG. 24, a state of the ceramic heater attached to a thermal CVD device is shown in cross-sectional view wherein reference numeral 1 is a housing used in CVD for producing semiconductors, reference numeral 2 is a disc-shaped ceramic heater for heating wafers attached to an inner case 8 of the housing or chamber 1, and a wafer heating surface 16 has an adjustable size of 4-8 inches capable of placing a wafer thereon.

The housing 1 is supplied therein with a gas for thermal CVD through a gas supply hole 1a and evacuated from a suction hole 1b by a vacuum pump. The disc-shaped ceramic heater 2 is made of a dense and gastight disc-shaped ceramic substrate 4 having a heat-generating resistive body 5 spirally embedded therein.

Reference numeral 13 is a flange having a water-cooled jacket 11 and covering the upper surface of a case 8. The flange 13 is sealed from the side wall of the housing 1 by an O-ring 12 thereby to constitute the ceiling plate of the housing 1. Reference numeral 9 is a hollow sheath penetrated through the wall of the flange 13 of the housing 1 into the interior of the housing 1 and connected to the ceramic heater 2. The hollow sheath 9 has in its interior a thermocouple 10 with a stainless sheath inserted therein. Between the hollow sheath 9 and the flange 13 of the housing 1 an O-ring is provided to prevent invasion of air.

The heat-generating resistive body 5 is connected at its ends to block-shaped terminals 31 which are connected to terminals 36 (in a later described supply cable 7. An electric power is supplied to the heating body 5 through the cable 7 from the exterior to heat the disc-shaped ceramic heater 2 to a temperature of, e.g., 1,100° C. at the maximum.

EXAMPLE 11

Next, structure of the block-shaped terminal 31 will be explained with reference to FIGS. 19-23.

In this embodiment, the block-shaped terminal 31 and the heating resistive body 5 were connected or press contacted to each other by a so-called caulking.

Figure 21:
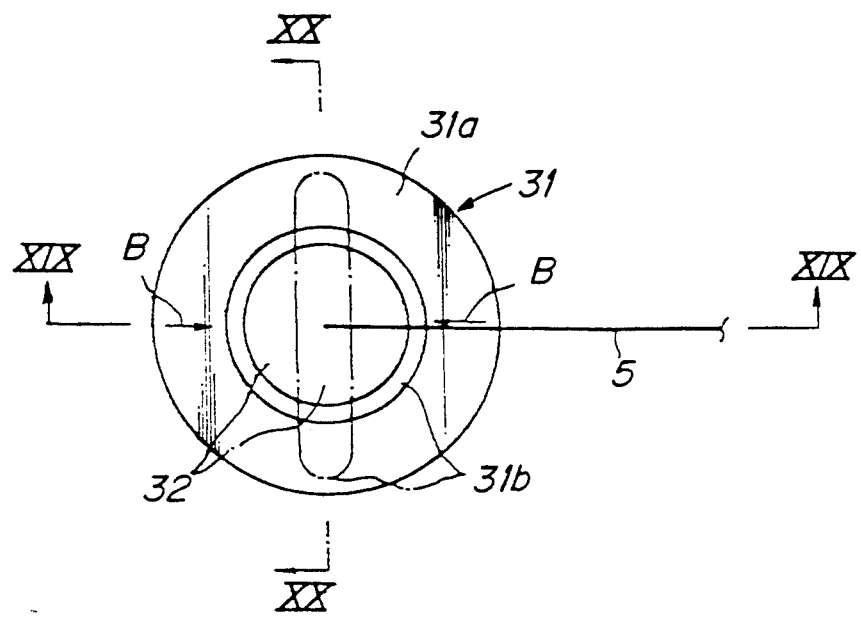
FIG. 21 is a bottom view of a block-shaped terminal 31 before it is caulked and press contacted.
Figure 22:
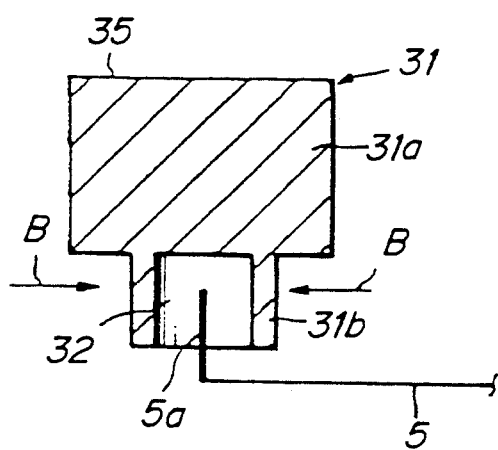
FIG. 22 is a cross-sectional view of a block-shaped terminal 31 before it is caulked and press contacted.
Figure 23:
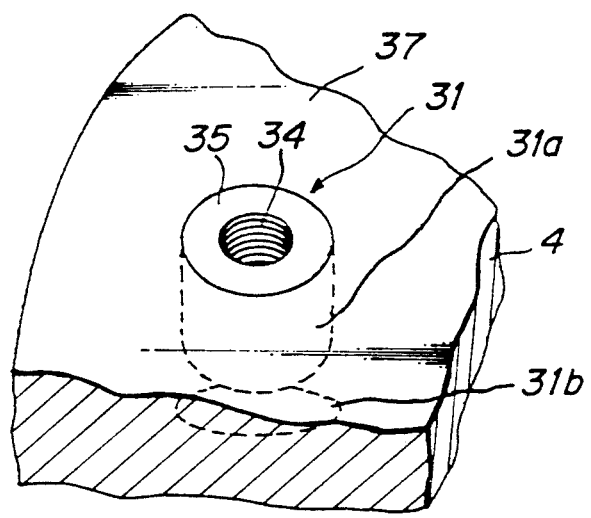
FIG. 23 is a broken perspective view of a ceramic substrate 4 having a block-shaped terminal 31 embedded therein.

At first, block-shaped terminals 31 as shown in FIGS. 21 and 22 were prepared which were made of a high melting point metal and consisted of a columnar body 31a and a cylindrical press contacted portion 31b.

The end portions 5a of the heating resistive body 5 were inserted in the space 32 of the cylindrical press contacted portion 31b and then an external pressure was applied to the cylindrical press contacted portion 31b to deform the same into a shape as shown by the one dot line so as to fix the end portions 5a of the heating resistive body 5. In the caulking process, the block-shaped terminals 31 were preferably heated to a high temperature of at least 800° C. under a reducing gas atmosphere.

Then, the block-shaped terminals 31 were embedded in a press formed ceramic body which was then fired to produce the ceramic substrate 4. The rear side 37 of the substrate 4 was processed by grinding to expose the end surfaces 35 of the block-shaped terminals 31. The block-shaped terminals 31 were threaded to provide with a female thread 34. Alternatively, the female thread 34 may be provided on the terminals 31 before embedding them in the press formed ceramic body.

Figure 19:
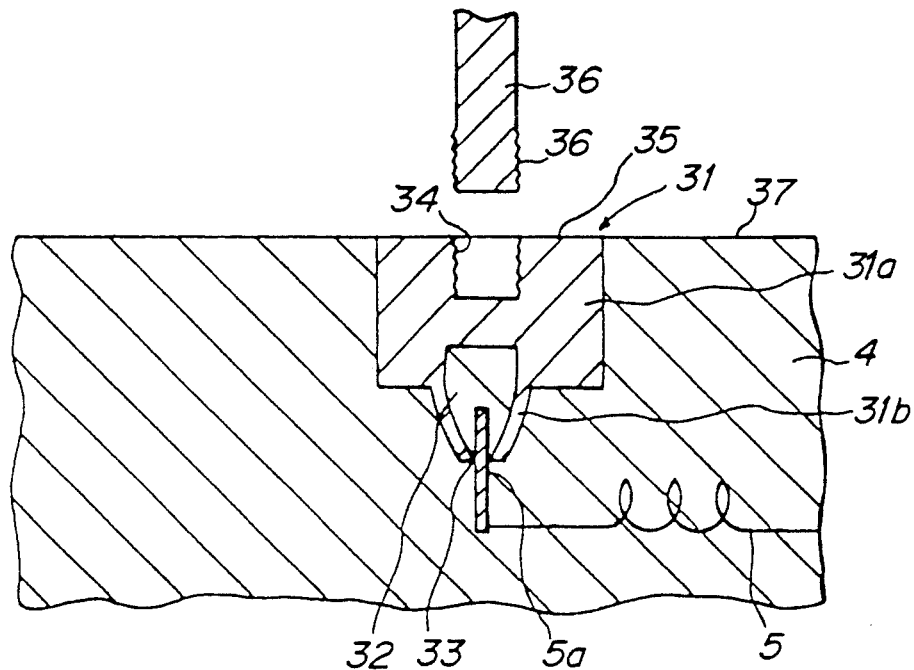
FIG. 19 is a cross-sectional view of a ceramic substrate 4 showing a state of having a block-shaped terminal 31 embedded therein and corresponds to a cross-section of FIG. 21 taken along the line XIX—XIX.
Figure 20:
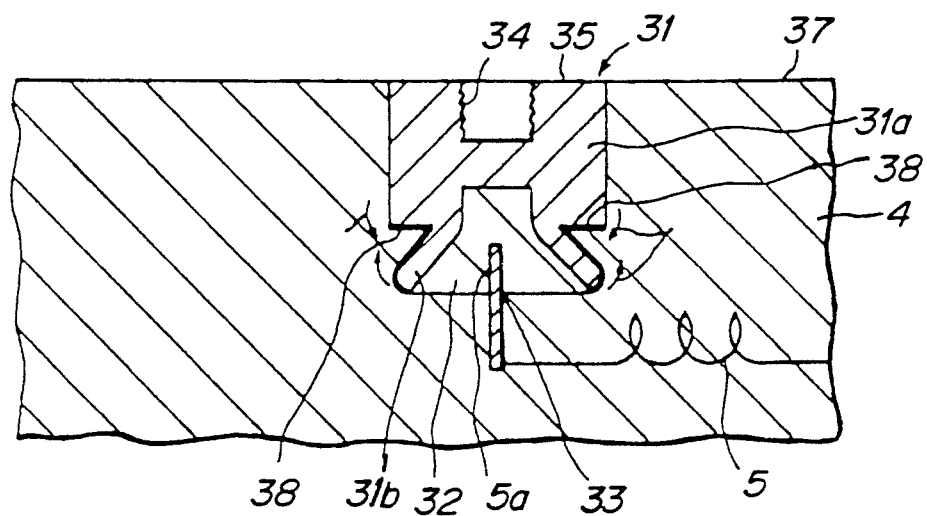
FIG. 20 is a cross-sectional view of a ceramic substrate 4 showing a state of having a block-shaped terminal 31 embedded therein and corresponds to a cross-section of FIG. 21 taken along the line XX—XX.

At this stage, when viewed FIG. 21 along the line XIX—XIX, the press contacted portion 31b was in a flatly crushed state as shown in FIG. 19, and when viewed FIG. 21 along the line XX—XX, the press contacted portion 31b was in a broadened state as shown in FIG. 20. The end portions 5a of the heat-generating resistive body 5 and the press contacted portion 31b were jointed by a so-called caulking structure. The female threads 34 were threadedly engaged with male threads 36a of the terminal 36 of the electric power supply cable 7.

According to the present invention, the block-shaped terminals 31 were made of a high melting point metal having a coefficient of thermal expansion (referred a "CTE", hereinafter) larger than CTE of the ceramic substrate 4.

As a material for the ceramic substrate 4, an aluminum nitride sintered body was used.

CTE of aluminum nitride and high melting point metals usable as the block-shaped terminal 31 and the heat-generating resistive body 5 are shown below.

| | |
|---|---|
| Tungsten | $4.35 \times 10^{-6}/°C$. |
| Molybdenum | $5.20 \times 10^{-6}/°C$. |
| Niobium | $7.31 \times 10^{-6}/°C$. |
| Tantalum | $6.5 \times 10^{-6}/°C$. |
| Rhenium | $6.70 \times 10^{-6}/°C$. |
| Rhodium | $8.30 \times 10^{-6}/°C$. |
| Iridium | $6.8 \times 10^{-6}/°C$. |
| Osmium | $4.6 \times 10^{-6}/°C$. |
| Aluminum nitride | $4.50 \times 10^{-6}/°C$. |

According to the ceramic heater of the example, the prior problems of the contamination as in metallic heaters and deterioration of heat efficiency as in indirect heating systems can be solved.

In heaters, etc., made of silicon nitride for glow plugs as disclosed in Japanese Utility Model Publication No. 60-30,611, the electrode portion is disposed in air of not more than 500° C. and the terminals of heating resistive wire are joined to the cables of the electrodes by a silver solder to electrically connect them to each other. Thus, though the heating portion was high in temperature, the electrode portion of the heater could be disposed at outside of the housing which was low in temperature.

However, the same effect as described above can be achieved in ceramic heaters having a heating resistive body therein as in this example, because a heating resistive body has to be put, press formed and fired in a ceramic powder and hence a simple shape, such as, disc or plate, etc., of the press-formed body has to be chosen for the press forming as in this example. Moreover, the fired body after the firing has a fired layer of modified composition which is called "black skin" which has to be removed by processing. In such a case, a grinding work by a diamond grinding stone is necessary, and the grinding cost is increased if the fired press-formed body has a complicated configuration. Thus, the ceramic heaters having a heat-generating resistive body embedded therein should be produced into a simple shape, such as, disc, or plate, etc., as in this example, from the viewpoint of difficulty of the production. By accommodating the whole of the ceramic heater in the housing 1 of the thermal CVD device due to the above reason, the electrode portion of the ceramic heater is also accommodated in the housing 1.

Usually, various corrosive gases are used in semiconductor production apparatuses, therefore, a corrosive gas invades unavoidably behind the rear side 37 of the heater. Also, the connecting portion between the block-shaped terminal 31 and the terminal 36 is repeatedly exposed to elevation and lowering of the temperature. In such a severe condition, the joining portions are rapidly deteriorated if a usual soldering is used for the joining. Nevertheless, regarding this point, the columnar block-shaped terminal 31 and the columnar terminal 36 were joined by threaded engagement in this example, so that deterioration of the joining portions due to heat and the corrosive gas could be prevented to improve the reliability and durability of the heater.

What is very important in this case is the use of the block-shaped (columnar, in this embodiment) terminals and not the wire-shaped terminals as in the cases of prior heaters, e.g., heaters for heating glow plugs. By the provision of the block-shaped terminals, the exposed end surface 35 can have a round shape as well as a large surface area and can be provided with a female thread for use as a terminal. For example, when a threading method is adopted as in this embodiment, the exposed end surface 35 may have a diameter of, e.g., 5 mm and the columnar body 31a may have a diameter of, e.g., 8 mm. The caulking portion 31b may have a thin-walled tubular shape before the caulking of, e.g., an outer diameter of 3 mm, an inner diameter of 2 mm, and a length of 3 mm, and is connected to a resistive wire made of tungsten having a diameter of, e.g., 0.4 mm. By the use of the block-shaped terminals, the heat resistant and corrosion resistant connection of the electrodes was realized.

EXAMPLE 12

Next, what is important is the constitution of the block-shaped terminal 31 from a high melting point metal having a CTE larger than CTE of the ceramic substrate 4. The reasons thereof will be explained below.

The inventors actually produced the ceramic heaters 2 as shown in FIGS. 19-24. In this case, the substrate 4 was made of aluminum nitride, and the heat-generating resistive body 5 was a spirally wounded wire of tungsten of a diameter of 0.4 mm. The body portion of the block-shaped terminal 31 was made of tungsten and has a columnar shape of a diameter of 5 mm and a length of 8 mm. However, if the block-shaped terminal 31 was embedded in a desired position of the press-formed body destined for the ceramic substrate 4 and the press-formed body was fired, cracks were found to occur around the block-shaped terminal 31 at the time of cooling the fired press-formed body.

Figure 25:
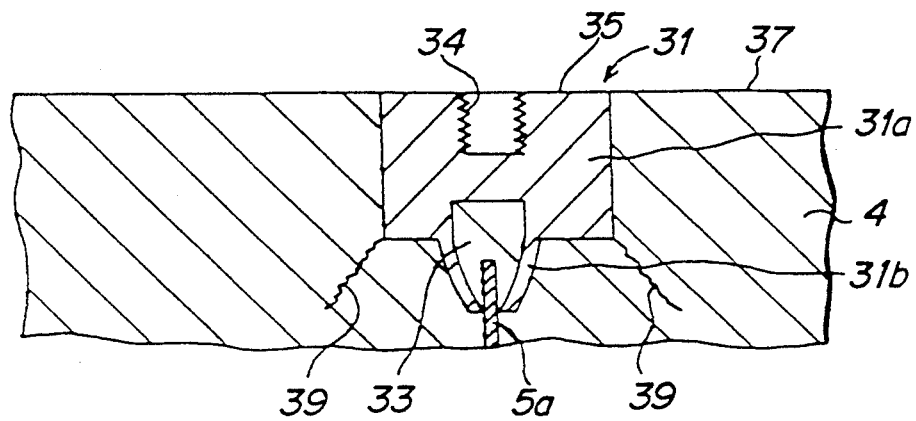
FIG. 25 is a cross-sectional view of a ceramic substrate 4 having a block-shaped terminal 31 embedded therein and a crack 39 formed therein.
Figure 26:
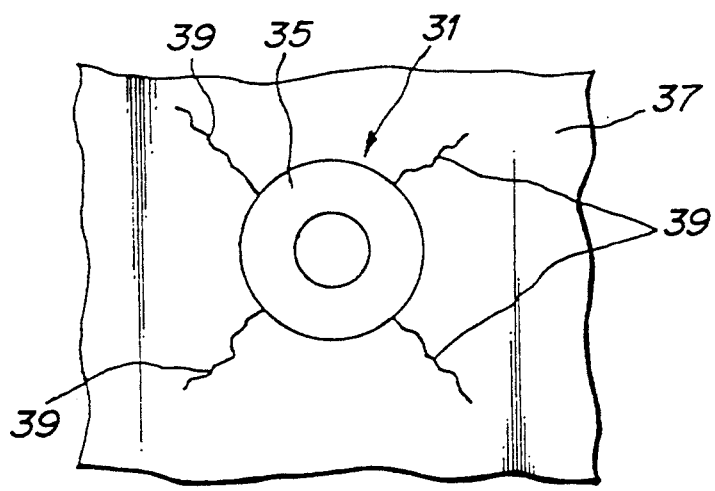
FIG. 26 is a plan view of a ceramic substrate having a block-shaped terminal 31 embedded therein and a crack 39 formed at the rear side 37 thereof.

Particularly, when the block-shaped terminal 31 was seen by a cross-sectional view taken along the longitudinal direction, the cracks 39 were found to have formed at the portions where the outline of the configuration of the block-shaped terminal 31 was bent, as shown in FIG. 25. Also, when viewed the heater from the rear side in plan view, the cracks 39 were found to extend from the outer circumferential periphery of the block-shaped terminal 31 which is round in plan view to the outer direction of the round periphery. However, such cracks were not found to form around the heat-generating resistive body 5.

Therefore, the inventors made further researches and experiments to find out that the cracks do not occur in the block-shaped terminal 31 if the CTE of the high melting point metal constituting the block-shaped terminal 31 is higher than the CTE of aluminum nitride. This fact is considered due to a relation between the extent of the thermal shrinkage of the ceramic substrate 4 and that of the block-shaped terminal 31 after the firing.

The inventors made further researches and studies on a reason why the cracks are not formed around the heat-generating resistive body 5. As a result, the inventors have found out that the crack is not formed if the embedded columnar body has a diameter of not more than 2.0 mm, even if the CTE of the high melting point metal constituting the block-shaped terminal 31 is smaller than the CTE of aluminum nitride. The diameter of the heat-generating resistive body 5 is 0.4 mm in the above example, and preferably 0.8 mm usually. In this way, a crack is not formed around the heat-generating resistive body 5, if the embedded columnar body has a diameter of not more than 2.0 mm. This fact that the size of the embedded body has an influence over the formation of the cracks was quite surprising and the reason thereof is not yet found.

The inventors ascertained on formation of the cracks when various sizes and materials of the terminal body was respectively embedded in the heat-generating resistive body 5. The experimental results are shown below.

Each body to be embedded in the heating resistive body respectively having a material, a shape and a size as shown below was embedded in a press-formed aluminum nitride sintered body added with 5 wt% of $Y_2O_3$, fired at 1,900° C. for 2 hrs, and left cool to ascertain formation of the cracks.

TABLE 4

| No. | Material | Shape | Size (mm) |
|---|---|---|---|
| 1 | W | coil-shaped wire | diameter 0.4 |
| 2 | " | coil-shaped wire | diameter 1.0 |
| 3 | " | block-shaped terminal 31 | diameter 3.0, length 5 |
| 4 | " | block-shaped terminal 31 | diameter 5.0, length 8 |
| 5 | Mo | block-shaped terminal 31 | " |
| 6 | Nb | block-shaped terminal 31 | " |
| 7 | Ta | block-shaped terminal 31 | " |
| 8 | Re | block-shaped terminal 31 | " |
| 9 | Rh | block-shaped terminal 31 | " |
| 10 | Ir | block-shaped terminal 31 | " |
| 11 | Os | block-shaped terminal 31 | " |

In sample Nos. 3–11, the values shown in the size column are the sizes of the columnar body 31a among the block-shaped terminal 31.

In the above experiments, the cracks were not formed and insufficient cohesion of the embedded body and the aluminum nitride did not occur in sample Nos. 1, 2, 5, 7, 8, 10 and 11. In sample No. 3, a minute crack was formed on the substrate. This is because the columnar body 31a diameter of 3.0 mm, so that a somewhat smaller CTE of the tungsten than that of the ceramic substrate affected an adverse influence. In sample No. 4, a crack was formed. In sample Nos. 6 and 9 wherein niobium and rhodium was respectively used, insufficient cohesion between the columnar body and the ceramic substrate was clearly seen.

Even in sample No. 5, a certain gap was ascertained between the columnar body of molybdenum and the aluminum nitride when observed under a microscope. Hence, an alloy consisting of 20% of molybdenum and 80% of tungsten was prepared next, and the alloy was used to prepare a columnar body of a length of 8 mm and a diameter of 5.0 mm. The alloy had a linear CTE of $4.95 \times 10^{-6}/°C$. In this case, a gap was not observed between the columnar body of the alloy and the aluminum nitride.

In sample Nos. 6 and 9, breakage of the connection were seen between the block-shaped terminal 31 and the coil-shaped wire (namely, the heating resistive body 5) connected thereto. On the other hand, if the columnar body was formed from the alloy consisting of 20% of molybdenum and 80% of tungsten, insufficiency and breakage, etc., of the electrical connection were not formed at all, even when the columnar body was subjected to an endurance test consisting of 1,000 cycles of a repetition of a cycle of temperature elevation from room temperature to 1,000° C., holding thereat for 1 hr, and temperature lowering to room temperature.

The high melting point metals as illustrated in the above Table 4 can also be used as a material of the heating resistive body 5, respectively. However, the cracks were not formed on the ceramic substrate 4 even when the heating resistive body 5 was made of tungsten, if the heating resistive body 5 had a diameter of not more than 2.0 mm. Therefore, the heat-generating resistive body 5 is more preferably made of tungsten, so far as it has a diameter of within this range. For instance, if the heating resistive body 5 is made of, e.g., molybdenum, there arises a danger that metal grains are developed in the heating resistive body 5 to make the heating resistive body 5 brittle and hence cause breakage of the connection thereof between the block-shaped terminal.

Next, what is important is the constitution of the block-shaped terminal 31 from a high melting point metal having a CTE larger than CTE of the ceramic substrate 4. The reasons thereof will be explained below.

Next, advantageous effects resulting from the specific shape of the block-shaped terminal 31 used in the embodiments as shown in FIGS. 19-24 will be explained below.

As described in the foregoing explanations, one of the block-shaped terminals 31 has a larger CTE than that of the ceramic substrate 4. Therefore, the extent of shrinkage of the block-shaped terminals 31 is larger than the extent of shrinkage of the ceramic substrate 4. Therefore, there sometimes occur a situation that a some gap is formed between the terminal body 31a and the ceramic substrate 4. In such a case, there arise little problem if the block-shaped terminals 31 is made of a Mo-W alloy, etc. However, there can occur a danger that the block-shaped terminals 31 is fallen away, when the gap between the terminal body 31a and the ceramic substrate 4 is large and the press contacted portion 31b is not provided. Regarding this point in this embodiment, the terminal body 31a is fixedly engaged within the ceramic substrate 4 by means of the press contacted portion 31b, so that there is no afraid of the block-shaped terminals 31 being fallen away.

If the press contacted portion 31b is not provided, a gap is formed between the terminal body 31a and the ceramic substrate 4 as described above and the block-shaped terminals 31 is swayed, when the difference of CTE between the terminal body 31a and the ceramic substrate 4 is considerably large. The brittle heat-generating resistive body 5 is drawn by the sway of the block-shaped terminals 31, so that there also arises a danger that the brittle heating resistive body 5 is broken off or severed. Moreover, there also arises a danger that the corrosive gas in the CVD device invades through the gap between the terminal body 31a and the ceramic substrate 4 to directly corrode the heating resistive body 5. In such a case, the electrical conductivity between the block-shaped terminals 31 and the heat-generating resistive body 5 becomes bad.

Regarding this point, the present invention has an important feature that a press contacted surface 38 is formed by shrinkage fit by means of firing as explained below between the block-shaped terminals 31 and the ceramic substrate 4 among the region between the press contacted portion 31b and the terminal body 31a.

Namely, at the stage of embedding the block-shaped terminals 31 in the press-formed ceramic body, the ceramic material to be press formed invades also between the press contacted portion 31b and the terminal body 31a. If the press formed body is fired, the block-shaped terminals 31 made of a heat resistant metal has a larger extent of thermal shrinkage than the extent of thermal shrinkage of the ceramic substrate 4 at the cooling stage after the firing, so that a compression stress as shown by the arrow is exerted to form the press contacted surface 38. The inventors call herein such fixing method as "firing caulking". By forming the press contacted surface 38 by the firing caulking in this way, the block-shaped terminals 31 are prevented from swaying.

Moreover, the ceramic material to be press formed invades also in the space 32 in the caulking portion 31b, so that a caulking surface is also formed by the firing caulking in the same manner as described above, which caulking surface gastightly seal the terminal body 31a from the ceramic substrate 4. Therefore, the connecting portions 33 between the block-shaped terminals 31 and the heating resistive body 5 are not exposed to the corrosive gas, so that deterioration and defect of the electrical conductivity at the connecting portions 33 can be prevented.

Furthermore, because the extent of thermal shrinkage of the block-shaped terminals 31 is larger than that of the ceramic substrate 4, the caulking surface caused by the above mentioned firing caulking is always formed under the heat cycle used as a heater at a temperature below the firing temperature, so that the block-shaped terminals 31 are stable to cooling and heating cycles thereof. In order to fire the press-formed ceramic body, firing at atmospheric pressure may be used, however, a hot press method or a hot isostatic press method should preferably be used for eliminating the gap between the block-shaped terminals 31 and the press-formed ceramic body. When producing the disc-shaped ceramic substrate 4 as shown in FIGS. 19-24 by the hot press firing, the block-shaped terminals have preferably a length of not more than $\frac{1}{2}$ t and the exposed end surface 35 has a diameter of not more than $\frac{1}{4}$ t, when taken the thickness of the disc-shaped ceramic substrate 4 as t. The exposed end surface 35 has preferably a diameter of not less than 4 mm in order to achieve mechanical connection, such as, threading, etc., or heat-resistant and corrosion-resistant connection, such as, later described diffusion connection, etc.

In the embodiment shown in FIG. 19, the connection between the block-shaped terminals 31 and the terminal 36 was effected by threading means. However, connecting means is not restricted solely to the threading means, and various other connecting or joining means which are stable to the cooling and heating cycle and the corrosive gas can be adopted including the following connecting or joining means.

The joining means via the high melting point joining layer are as follows.
(1) To interpose a powder of a high melting point metal between the block-shaped terminals and the terminals at the electrode cable side and diffuse the powder therebetween to perform the joining.
(2) To join by means of a solder.
(3) To interpose and diffuse a foil to perform the joining.
(4) To form an application layer on an end surface of the block-shaped terminals or an end surface of the terminals at the electrode cable side by plating, CVD, or melt spray, etc., and then perform diffusion joining or friction welding.

(5) To weld.

(6) To connect mechanically.

As mechanical connecting means, there are press fitting, caulking, embedding, inserting, or mechanical spring urging using a spring or an elastic board.

The shape of the terminal body 31a of the block-shaped terminals 31 can be modified variously, for example, to triangular column, elliptical column, tetragonal column, or hexagonal column. As a means for joining the heating resistive body, there are winding and welding other than the aforementioned caulking.

In the above examples, the ceramic heater has preferably a disc-shaped for uniformly heating the disc-shaped wafer, however, it can have other shape, such as, tetragonal or hexagonal shape, etc.

In the above examples, aluminum nitride added with an additive $Y_2O_3$ was used. The additive may be changed to adjust the relation of the CTE of the aluminum nitride and the CTE of the block-shaped terminals so as to meet the present invention.

EXAMPLE 13

The semiconductor wafer heating device of the other shapes and problems left will be explained in this example.

In semiconductor production apparatuses requiring a super clean state, a corrosive gas, such as, a chlorine series gas or a fluorine series gas is used as a corrosive gas, etching gas or cleaning gas. Thus, if a conventional heater wherein the surface of the heating resistive body is coated with a metal, such as, stainless steel or inconel, etc., is used as a heating device for heating the wafer under a contacting state with the corrosive gas, undesirable particles of chlorides, oxides, or fluorides, etc., of diameters of several $\mu$m are formed on the surface of the metal due to exposure thereof to the corrosive gas.

Therefore, a wafer heating apparatus of an indirect heating system was developed wherein an infra red lamp is arranged at outside of the housing in which the wafer is exposed to deposition gas, etc., a window for permeating an infra red radiation beam therethrough is provided on the outer wall of the housing, and an infra-red radiation beam is irradiated on a heating body to be heated made of graphite, or the like good heat resistant material, etc., to heat the wafer placed on the heating body. However, the apparatuses of this heating system have problems in that it requires a large heat loss as compared with those of the indirect heating system, a considerable time is required for elevating the temperature, and the permeation of the infra red radiation beam is gradually prevented due to adhesion of the CVD film on the infra red radiation beam-permeating window to gradually overheat the window by the heat absorption of the window for example.

EXAMPLE 14

Figure 27:
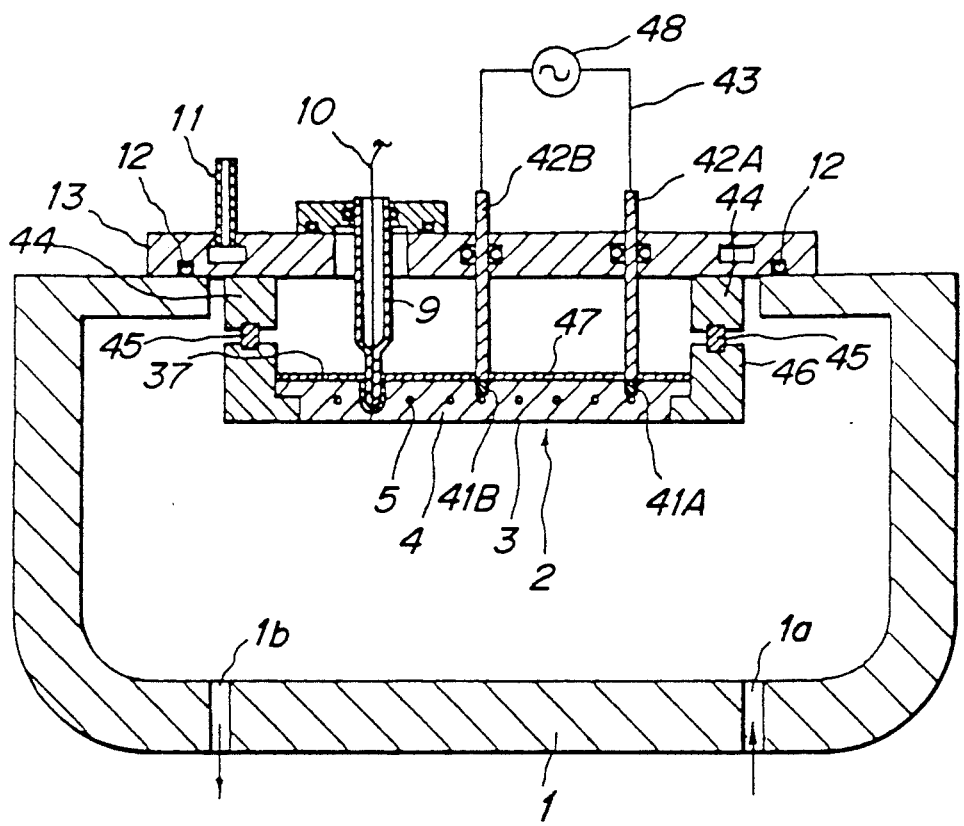
FIG. 27 is a schematic cross-sectional view of a semiconductor wafer heating device developed by the present inventors attached to a housing thereof.

In order to solve such problems, the inventors have previously developed a heating apparatus as schematically shown in FIG. 27.

Referring to FIG. 27, reference numeral 1 is a body of the housing used in a CVD device for the production of semiconductors, reference numeral 2 is a disc-shaped ceramic heater attached to an inner case of 46 of the housing body 1 for heating the wafers, and reference numeral 3 is a wafer heating surface having an adjustable size of 4-8 inches capable of mounting a wafer thereon. A flange portion 13 has at its under side a ring 44 fixed thereto for attaching a case, and the ring 44 for attaching the case has at its under side a case 46 fixed via an insulative ring 45. The ring 44 for attaching a case and the ring 46 have a small gap therebetween so as not to allow them to contact directly with each other.

The housing body 1 is supplied in its interior with a gas for thermal CVD through a gas supply hole 1a, and the interior gas is evacuated from a suction hole 1b by means of a vacuum pump. The disc-shaped ceramic heater 2 has a heating resistive body 5 made of tungsten series, etc., spirally embedded in a dense and gastight disc-shaped ceramic substrate 4 made of aluminum nitride sintered body.

The disc-shaped ceramic substrate 4 has at its rear surface 37 a pair of block-shaped terminals 41A, 41B which are connected to the heating resistive body 5. The block-shaped terminals 41A, 41B are connected to to an end of stud-shaped electrode members 42A, 42B, respectively. Each electrode member 42A, 42B is inserted through a throughhole of the flange portion 13 of the housing, and each electrode member 42A, 42B and the flange portion 13 are gastightly sealed by an O-ring 12. The other end of the electrode members 42A, 42B is connected to a lead wire 43, respectively, and a pair of the lead wire 43 is connected to an alternating current power source 48. The heating resistive body 5 is supplied with an electric power through the pair of the lead wire 43 to heat the disc-shaped ceramic heater 2 upto a temperature of, e.g., around 1,100° C. at the maximum. The flange portion 13 equipped with a cooling water jacket 11 covers a case 46 from the above, and are airtightly sealed from the housing body 1 by means of an O-ring 12, and constitutes a ceiling wall of the housing. Reference numeral 9 is a hollow sheath inserted into the interior of the housing through the wall of the flange portion 13 and connected to the ceramic heater 2. The hollow sheath 9 has in its interior a thermocouple 10 inserted therein equipped with a stainless steel sheath. The hollow sheath 9 and the flange portion 13 has an O-ring therebetween to prevent invasion of the air therein.

However, the inventors have found out that when a such semiconductor wafer heating device is used practically in a semiconductor production apparatus, there still occur the following problems.

That is, if a gas for CVD is supplied to the semiconductor production apparatus, the gas invades unavoidably behind the rear surface 37 of the heater to form a deposition film 47 on the rear surface 37 of a high temperature. The deposition film 47 made of a metal is electrically conductive, hence the pair of electrode members 42A, 42B are short-circuited to each other, so that the ceramic heater can not be used any more.

The inventors produced the electrode members 42A, 42B from a corrosion-resistant metal, such as, molybdenum, etc. However, the inventors have found out that, if the heating device is used for long time in a semiconductor production apparatus using an etching gas, corrosion of the electrode members 42A, 42B are progressed sometimes to deteriorate the property of the ceramic heater 2.

Also, there remains a problem on the thermocouple 10. At first, a reason of the provision of the hollow sheath 9 will be explained. According to researches of the inventors, particularly in case of in vacuum, it was found out that gas molecules around the thermocouple 10 behave as if they are in a viscous region at a vacuum state of atmospheric pressure 1 Torr, however, they behave as if they are in a molecule region with increase of the extent of vacuum and accompanying thereto the mode of heat transfer around the thermocouple 10 is widely changed to cause exact measurement of the temperature impossible. It has been also found out that even in the viscous region an error of measurement of temperature exists if fluctuation of the pressure is large. In order to prevent such a problem, the inventors accommodated the thermocouple 10 in a hollow sheath 9. The hollow sheath 9 was constituted from a high melting point metal, such as, molybdenum, etc. However, the inventors have found out that in a semiconductor production apparatus mixed contacting and induction occur sometimes to decrease the accuracy of measuring the temperature, because a high frequency power source or a high voltage power source is used in the semiconductor production apparatus.

EXAMPLE 15

An embodiment of such semiconductor wafer heating device using a tubular body will be explained in this example.

Figure 28:
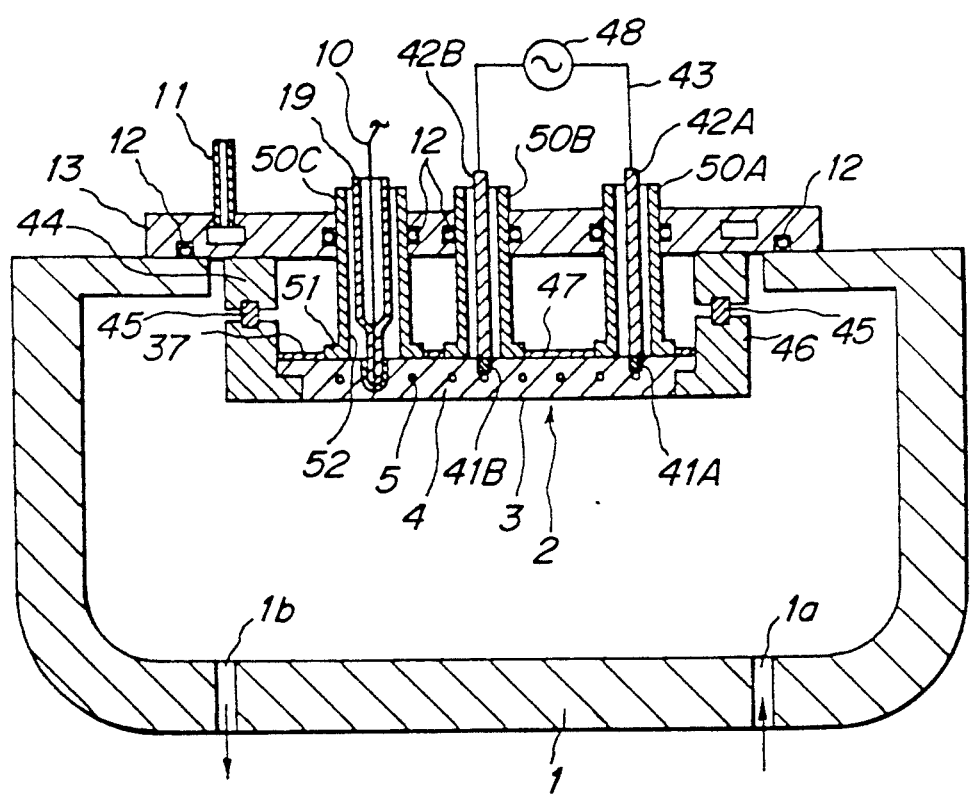
FIG. 28 is a schematic cross-sectional view of a semiconductor wafer heating device of an embodiment of the present invention attached to a housing thereof.
Figure 29:
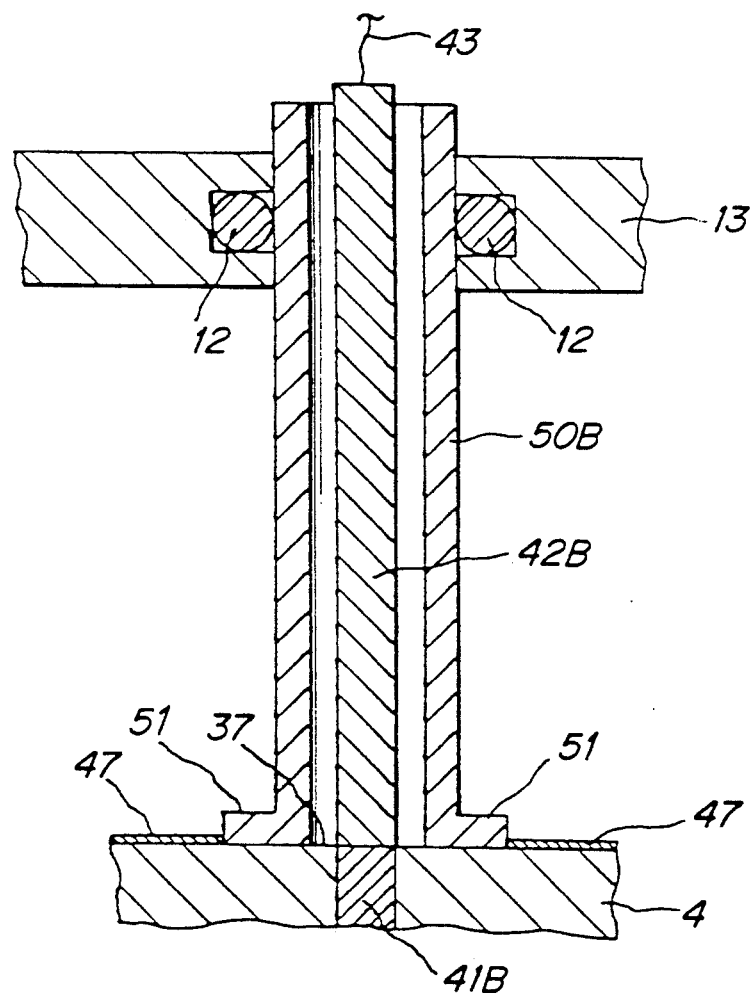
FIG. 29 is an enlarged cross-sectional view of a main portion of FIG. 28.

Referring to FIG. 28, a schematic cross-sectional view of an embodiment of the heating device of the present invention attached to the housing is shown and FIG. 29 is an enlarged cross-sectional view of a main portion of FIG. 28. In the Figures, the same reference numerals with those of FIG. 27 indicate the same members with those of FIG. 27 and explanations thereof are sometimes omitted.

At first, cylindrical bodies 50A, 50B, and 50C are prepared. Each cylindrical bodies 50A, 50B, and 50C has a ring-shaped flange portion 51 at the bottom thereof. Material and production method thereof will be explained below.

The bottom of the cylindrical bodies 50A, 50B, and 50C are joined to a rear surface 37 of the heater and integrally joined to the disc-shaped ceramic substrate 4. In this embodiment, the flange portion 13 has round throughholes at three portions through which each cylindrical body 50A, 50B, or 50C is inserted, respectively. The upper end surface of each cylindrical body 50A, 50B, and 50C is exposed to the exterior of the housing and the space in the interior of each cylindrical body 50A, 50B, and 50C is occupied by an atmosphere outside of the housing. The end portion of each cylindrical body 50A, 50B, and 50C is gastightly sealed from the ceramic substrate 4, and each cylindrical body 50A, 50B, and 50C is gastightly sealed electrically insulated from the flange 13 by an O-ring 12.

Each electrode member 42A, 42B is connected to the block-shaped terminal 41A, 41B, respectively. A method of the connection will be explained later. In the space in the interior of the cylindrical body 50A is fixed the electrode member 42A, and in the space in the interior of the cylindrical body 50B is fixed the electrode member 42B. In this embodiment, a hollow sheath 9 having a thermocouple 10 inserted therein is used as a temperature-measuring device and the hollow sheath 9 is fixed in the space in the interior of the cylindrical body 50C. By this arrangement, the pair of the electrode member 42A, 42B, the pair of the block-shaped terminal 41A, 41B, and the hollow sheath 9 are exposed to the atmosphere exterior of the housing.

According to this embodiment, even if an electrically conductive deposition film 47 is formed on the rear surface of the heater 37, the deposition film 47 is interrupted by the cylindrical bodies 50A, 50B, so that the electrode members 42A, 42B are prevented from short-circuiting. Also, the electrode members 42A, 42B are liberated from afraids of discharge and leakage between the housing. Moreover, the electrode members 42A, 42B are not exposed to the space in the interior of the housing, the corrosion of the electrode members 42A, 42B and the block-shaped terminals 41A, 41B and the accompanying contamination in the interior of the housing do not occur.

Furthermore, the electrode members 42A, 42B are not exposed to the corrosive gas, so that the necessity of selecting tungsten having a small coefficient of diffusion to the semiconductor wafer as the material of the electrode members 42A, 42B can be obviated. As a result, the electrode members 42A, 42B can be formed of a material other than tungsten.

Moreover, the hollow sheath 9 made of molybdenum, etc., is not exposed to the space in the interior of the housing, so that the possibility is eliminated of being contaminated by such a heavy metal. Also, the thermocouple 10 in the hollow sheath 9 can be insulated by the cylindrical body 50C made of an inorganic insulative material. As a result, mixed contacting and induction due to a high frequency power source or a high voltage power source used in a semiconductor production apparatus can be prevented, so that measurements of more accurate temperature became possible.

Furthermore, the cylindrical bodies 50A, 50B, and 50C have at their lower ends a ring-shaped flange portion 51, respectively, so that the rear surface 37 of the ceramic substrate 4 and the cylindrical bodies 50A, 50B, and 50C can have a large contacting surface area to achieve a sufficient joining force therebetween.

The sealing between the flange portion 13 of the housing and each cylindrical body 50A, 50B, and 50C can be performed by a metal packing, etc., other than the O-ring shown in FIG. 28.

The wafer-heating surface 3 is preferably a smooth and flat surface. Particularly, when the wafer is directly set or placed on the wafer-heating surface 3, it should have a smoothness of not more than 500 $\mu$m so as to efficiently heat that plate shaped wafer.

As the heat-generating resistive body 5, tungsten, molybdenum, or platinum, etc., having a high melting point and a high coherent property to the ceramic substrate is suitably used.

As the material of the cylindrical bodies 50A, 50B, and 50C, a dense ceramic is preferable. Particularly, if an aluminum nitride sintered body same as the disc-shaped ceramic substrate 4 is used as the material, the cylindrical bodies and the ceramic substrate 4 have no difference in thermal expansion therebetween, so that the residual stress in the joining portion after joining the both can be decreased. Therefore, reliability of the joining force between the both can be improved.

The joining between the cylindrical bodies 50A, 50B, and 50C and the disc-shaped ceramic substrate 4 is performed by the following way.

(1) In sintering a press-formed body for the ceramic heater 2 at atmospheric pressure or under hot press, the block-shaped terminals 41A, 41B and the heat-generating resistive body 5 are preliminarily embedded in the press-formed body. Thereafter, cylindrical bodies are prepared by injection molding, extrusion forming, press forming, or hydrostatic press forming, and sintered at atmospheric pressure to produce the cylindrical bodies 50A, 50B, and 50C. Each cylindrical body 50A, 50B, and 50C is gastightly joined to the disc-shaped ceramic substrate 4 at a desired position. As a joining method in this case, a soldering using a titanium vapor deposited gold solder, or a titanium vapor deposited silver solder, etc., or a glass joining is preferable. Particularly, the joining portion has preferably a sufficiently high transition temperature, so that a quartz glass or a hydroxynitride glass is preferably used for the glass joining.

(2) A press-formed body for the ceramic heater 2 and press-formed bodies for the cylindrical bodies 50A, 50B, and 50C are separately formed by injection molding, extrusion forming, press forming, or hydrostatic press forming, etc. These press-formed bodies are sintered at atmospheric pressure under fitting of a dimensional allowance of 1/100-10 mm or sintered under pressure of sufficiently pressing the press-formed body for the ceramic heater to the press-formed bodies for the tubular bodies.

EXAMPLE 16

Another embodiment of the semiconductor-heating device using the cylindrical bodies will be explained in this example.

Figure 30:
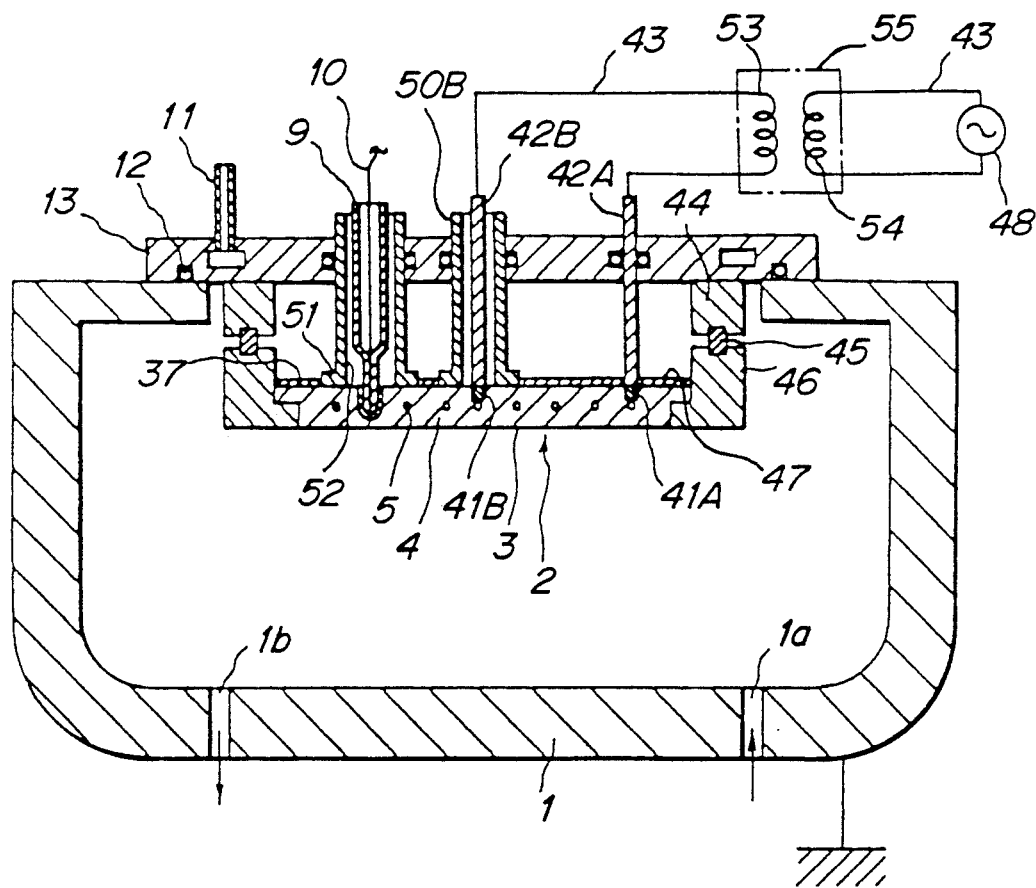
FIG. 30 is a schematic cross-sectional view of a semiconductor wafer heating device of an another embodiment of the present invention attached to a housing thereof.

Referring to FIG. 30, a state of another embodiment of the heating device of the present invention attached to a semiconductor-production apparatus is shown in a schematic cross-sectional view. The same reference numerals as shown in FIG. 27 are indicated by the same reference numerals and explanations thereof are sometimes omitted.

In this embodiment, one electrode member 42A was not protected by the cylindrical body, while the other electrode member 42B was protected by the cylindrical body 50B. The electrode members 42A, 42B were connected to a coil 53 through a lead wire 43, respectively, while an alternating current power source 48 was connected to a coil 54 through the lead wire 43. The coils 53 and 54 were opposingly disposed to form a double wound type insulative transformer 55. An electric power was supplied from an electric power source to the heating resistive body 5 through the insulative transformer 55.

In the insulative transformer 55, the electrode members 42A, 42B of the secondary side were arranged in a floating state relative to the alternating current power source 48 of the primary side. The housing body 1 was connected to the earth.

According to this embodiment, the electrode member 42B was protected and insulated by the cylindrical body 50B, so that short-circuiting and leakage did not occur between the electrode members 42A and 42B. Also, when the deposited film 47 was formed between the electrode member 42A and the case 46 or the flange portion 13, short-circuiting thereof to the earth did not occur.

Using the heating device of FIGS. 28 and 30, 1,000 sheets of silicon wafer were subjected to thermal CVD treatment. Used alternating current voltage of the alternating current power source was 200 volts. As the materials of the disc-shaped ceramic substrate 4 and the tubular bodies 50A, 50B, and 50C, aluminum nitride sintered bodies were used. As the materials of the heating resistive body 5, the block-shaped terminals 41A, 41B and the electrode members 42A and 2B, tungsten was used. As a result, current leakage from the electrode members 42A and 42B was not observed.

EXAMPLE 17

Figure 31:
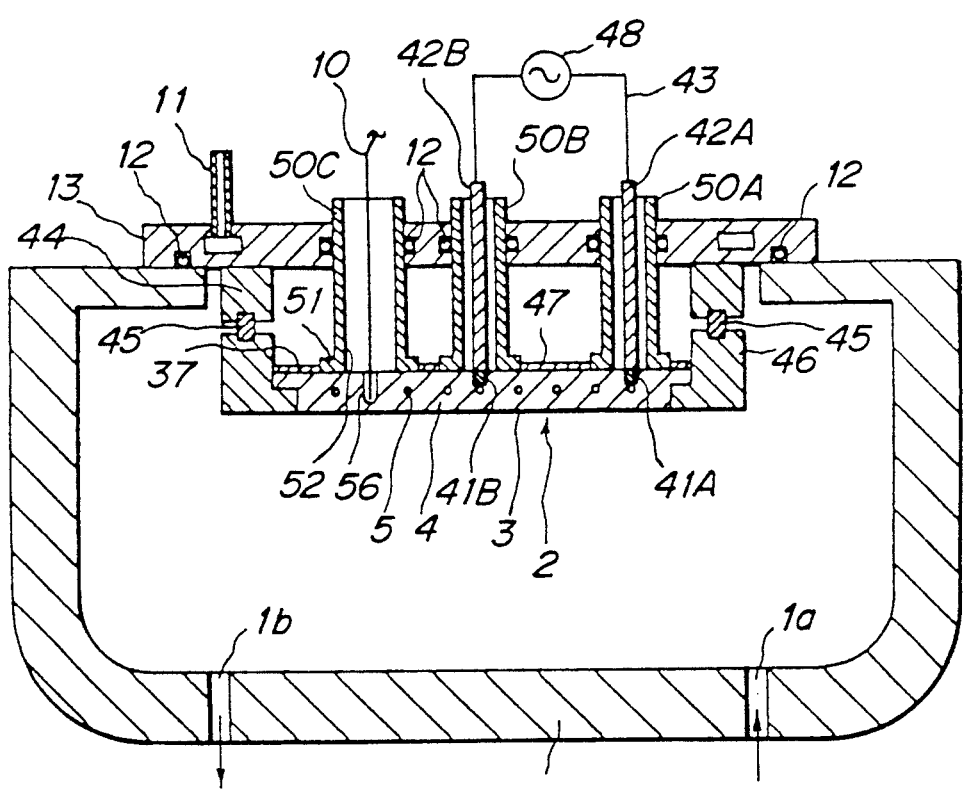
FIG. 31 is a schematic cross-sectional view of a semiconductor wafer heating device of a further embodiment of the present invention attached to a housing thereof.
Figure 32:
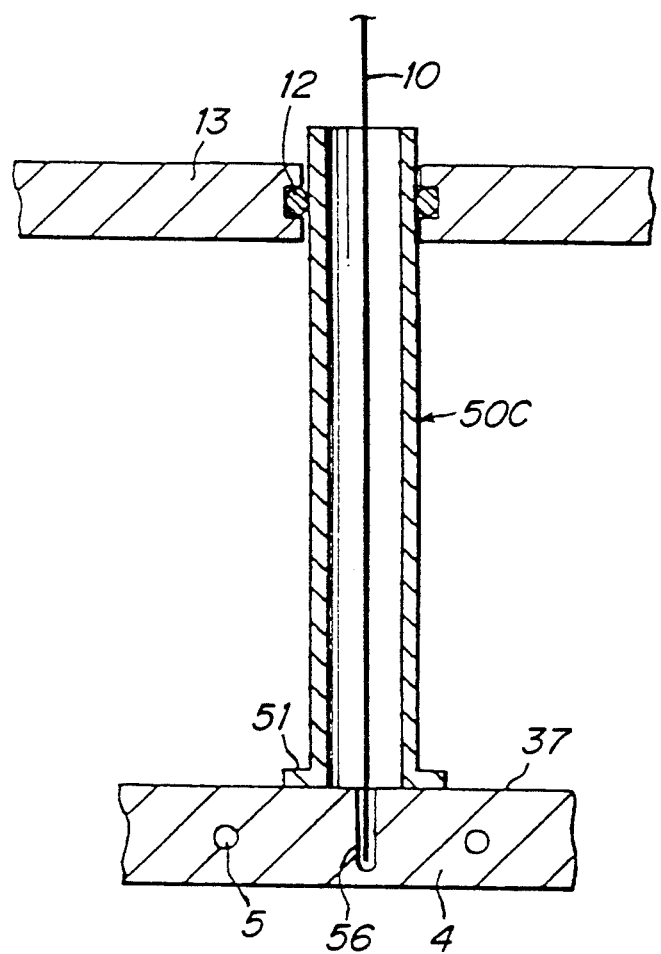
FIG. 32 is an enlarged cross-sectional view of the heating device of FIG. 31 showing a cylindrical body 50 and a neighboring portion thereof.

Referring to FIG. 31, a state of still another embodiment of the heating device of the present invention attached to the housing of a semiconductor-production apparatus is shown in a cross-sectional view. FIG. 32 is a partial enlarged view of FIG. 31. The same reference numerals as shown in FIG. 28 are indicated by the same reference numerals and explanations thereof are sometimes omitted.

In this embodiment, the hollow sheath 9 was omitted from the device of FIG. 28. A thin elongated insertion hole 56 opening at the rear surface 37 of the ceramic substrate 4 was provided and the distal end of the thermocouple 10 was inserted in the insertion hole 56. However, the distal end of the thermocouple 10 was not fixed in the insertion hole 56 with a glass, etc., in this embodiment. Also, the thermocouple 10 per se was used as the temperature-measuring device.

According to this embodiment, the following effects can be achieved in addition to the above effects. Namely, in this embodiment also, the thermocouple 10 can be insulated by the tubular body 50C made of an inorganic insulative material. Therefore, in this embodiment also, mixed contacting and induction resulting from the use of a high frequency power source or a high voltage power source can be prevented.

Also in this embodiment, the thermocouple 10 is separated from the atmosphere in the housing by the tubular body 50C. Therefore, even when the pressure of the atmosphere in the housing is rapidly fluctuated as described above, the measuring value by the thermocouple 10 is not influenced by the rapid fluctuation of the pressure.

Moreover, when compared the embodiment of FIG. 31 with the embodiment of FIGS. 28 and 30, a more accurate measuring temperature exactly reflecting an actual value can be obtained, because of the absence of the intervening hollow sheath 9 between the thermocouple 10 and the ceramic substrate 4. Because the sealing of the distal end of the hollow sheath 9 to form a tubular shape is a considerably difficult processing, the processing becomes a cause of the production efficiency. If the heating device is constructed to omit the hollow sheath 9, such considerably difficult processing can be dispensed with, so that the production efficiency can be improved.

EXAMPLE 18

Figure 33:
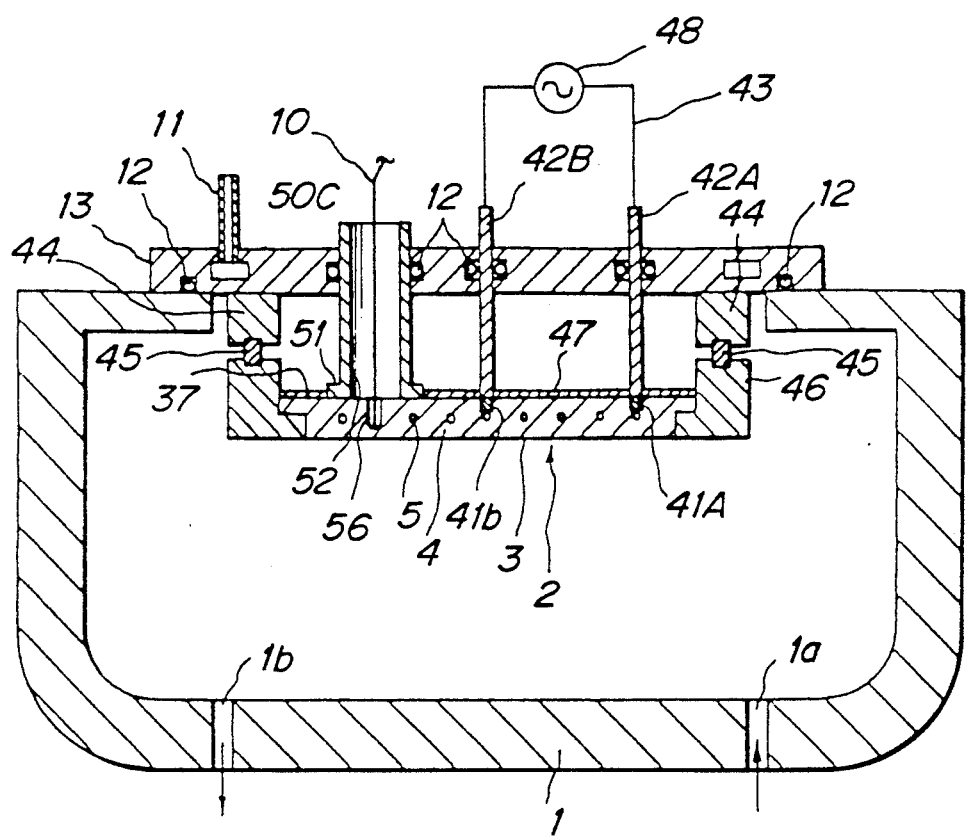
FIG. 33 is a schematic cross-sectional view of a semiconductor wafer heating device of a still further embodiment of the present invention attached to a housing thereof.
Figure 34:
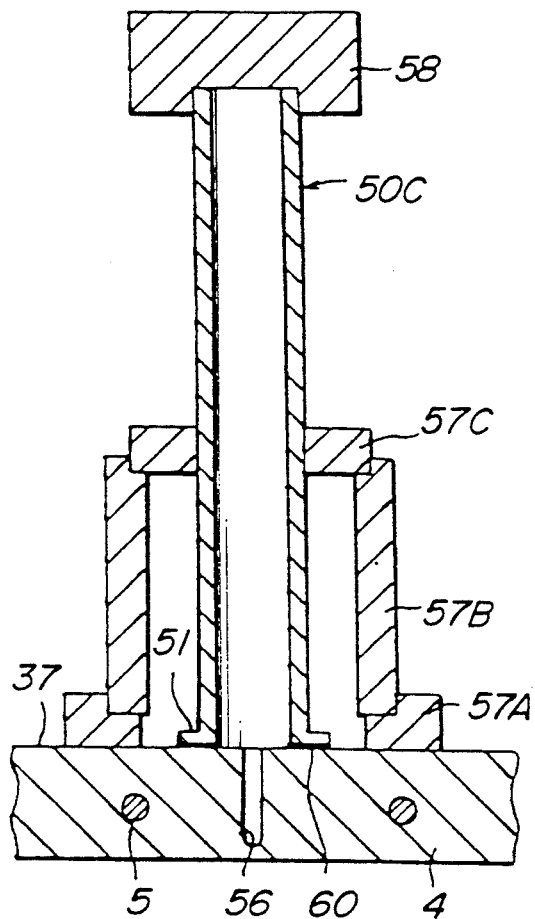
FIG. 34 is a cross-sectional view of a ceramic substrate 4 showing a state of immediately before connected to a cylindrical body 50C.

Referring to FIG. 33, a state of still further embodiment of the heating device of the present invention attached to the housing of a semiconductor-production apparatus is shown in a cross-sectional view. The same reference numerals as shown in FIGS. 27 and 31 are indicated by the same reference numerals and explanations thereof are sometimes omitted.

In this embodiment, the distal end of the thermocouple 10 was inserted in the insertion hole 56 and enclosed by the cylindrical body 50C to separate from the atmosphere in the housing. Therefore, with respect to this portion, the same effects as those of the embodiment of FIGS. 31 and 32 could be obtained.

EXAMPLE 19

Next, the cylindrical body 50C enclosing the thermocouple 10 as shown in FIGS. 31-33 was actually joined to the ceramic substrate 4.

That is, at first, an elongated columnar shaped insertion hole 56 opening to the rear surface 37 was formed at a desired portion of the disc-shaped ceramic substrate 4. The insertion hole 56 had a diameter of 3 mm and a depth of 12 mm. Both the ceramic substrate 4 and the cylindrical body 50C were formed of aluminum nitride sintered bodies and the heat-generating resistive body 5 was formed of tungsten. The cylindrical body 50C had an inner diameter of 6 mm and an outer diameter of 9 mm and a flange portion 51 thereof had an outer diameter of 15 mm. The tubular body 50C was joined to the ceramic substrate 4 by means of a glass.

However, in this case, at first, both the portions of the cylindrical body 50C and the rear surface 37 to be joined were worked by grinding to a surface roughness of not more than 0.8 s. In the meantime, a powder for a glass was prepared having the following components:

$SiO_2$:30 wt%, $Ni_3N_4$:10 wt%, $Al_2O_3$:30 wt%, $Y_2O_3$:30 wt%.

The powder was mixed, added with a binder, dispersed, and formed into a tape shape. Then, the tape was severed in such a shape to meet the shape of the joining surface of the flange portion 51 and the tape 60 after the severing was sandwiched between the rear surface 37 and the joining surface of the flange portion 51. The center line of the cylindrical body 50C was substantially positioned to the center of the insertion hole 56 and a weight 58 was mounted on the upper end surface of the cylindrical body 50C. The ceramic heater of this state was put in an electric furnace and heat treated in nitrogen atmosphere at 1,500° C. for 1 hr to join the tubular body 50C to the ceramic substrate 4.

Thereafter, insulation property thereof was ascertained. As a result, insulation property was ascertained of a resistance of at least 1 MΩ at a direct current of 500 MV and an alternating current withstanding voltage of at least 1 kV at 800° C.

Though in the embodiments shown in FIGS. 27-34 the treatment was effected by directing the wafer-heating surface downwards and supporting the wafer from downward by not shown pins, the wafer-heating surface may be directed to upwards. Also, in the embodiments shown in FIGS. 27-34 the heating device of the present invention was attached to the wall surface at the ceiling side of the housing, it may be attached to the wall surface at the ceiling side or the side wall of the housing. The ceramic heater has preferably a disc-shape for uniformly heating the round wafer, however, may have an other shape, such as, tetragonal or hexagonal shape, etc.

The tubular body can have tetragonal or hexagonal columnar shape other than the aforedescribed cylindrical bodies 50A, 50B, and 50C. The elongated electrode member can have an other shape, such as, tetragonal, hexagonal, cylindrical or woven wire shape, etc., other than the aforedescribed rod-shaped electrode members 42A, 42B.

The heating device of the present invention is applicable also plasma etching apparatuses, and photoetching apparatuses, etc.

Although the present invention has been explained with specific examples and numeral values, it will of course apparent to those skilled in the art that various modifications and changes can be made without departing from the broad spirit and aspect of the present invention as defined in the appended claims.

What is claimed is:

1. An apparatus comprising a substrate of aluminum nitride or alumina having a corrosion resistant outer surface film of aluminum trifluoride.

2. The apparatus of claim 1, wherein the substrate is a susceptor for heating a semiconductor wafer placed on a heating surface of a disc-shaped ceramic heater comprising a resistive-heating element embedded in a disc-shaped ceramic substrate.

3. A corrosion-resistant member to be exposed in use to a halogen series corrosive gas, comprising one of an aluminum nitride and alumina substrate, and a corrosion resistant outer surface film of aluminum trifluoride, said outer surface film contacting the corrosive gas.

4. The corrosion-resistant member of claim 1 for use in a semiconductor production apparatus, which is to be exposed to a halogen series corrosive gas in the semiconductor production apparatus.

5. The corrosion-resistant member of claim 2, wherein the corrosion resistant member is a susceptor for heating a semiconductor wafer, a surface of which is heated heating of an infra-red radiation lamp to heat the semiconductor wafer placed on the heated surface.

6. The corrosion-resistant member of claim 2, wherein the corrosion resistant member is a susceptor for heating a semiconductor wafer which is placed on a heat-generating surface of a disc-shaped ceramic heater comprising a heat-generating resistive body embedded in a disc-shaped ceramic substrate.

7. The corrosion-resistant member of claim 2, wherein the corrosion-resistant member is an electrostatic chuck having a structure comprising a disc-shaped sintered body and at least a film-shaped inner electrode embedded therein.

8. The corrosion-resistant member of claim 2, wherein the corrosion-resistant member is for heating a semiconductor wafer and which is to be exposed to a film-forming gas consisting of a halogen series corrosive gas at a film-forming temperature of 300-1,100° C. in a CVD device for producing the semiconductor.

9. The corrosion-resistant member of claim 2, wherein the corrosion-resistant member is for heating a semiconductor wafer and which is to be exposed to a film-forming gas at a film-forming temperature of 300-1,100° C. in a CVD device for producing semiconductor and which is to be exposed after the film formation to a cleaning gas consisting of a halogen series corrosive gas at a temperature of not less than 300° C. and not more than the above film-forming temperature.

10. The corrosion-resistant member of claim 2, wherein the corrosion resistant member is a heater for heating a semiconductor wafer said aluminum nitride sintered body having a heat-generating resistant body made of a heat-resistant metal embedded therein.

11. A ceramic heater, comprising a ceramic substrate comprising one of a dense aluminum nitride sintered body and a dense alumina sintered body, said sintered body having a corrosion resistant outer surface film of aluminum trifluoride, a resistive heating body made of a heat-resistant metal embedded in the interior of the ceramic substrate, and a block-shaped terminal electrically connected to the resistive heating body and embedded in the ceramic substrate so as to expose the end surface thereof from the ceramic substrate, the block-shaped terminal being formed of a heat-resistant metal having a coefficient of thermal expansion of not less than the coefficient of thermal expansion of the ceramic substrate.

12. The ceramic heater of claim 9, wherein the heat-resistant metal of the block-shaped terminal is selected from the group consisting of molybdenum, niobium, tantalum, rhenium, rhodium, iridium and osmium.

13. The ceramic heater of claim 9, wherein the heat-resistant metal of the block-shaped terminal is an alloy of tungsten and a metal selected from the group consisting of molybdenum, niobium, tantalum, rhenium, rhodium, iridium and osmium.

14. The ceramic heater of claim 9, wherein the block-shaped terminal has a diameter of not less than 2.0 mm.

15. The ceramic heater of claim 9, wherein the resistive heating body comprises a heat-resistant metal having a coefficient of thermal expansion smaller than a coefficient of thermal expansion of the ceramic substrate.

16. The ceramic heater of claim 13, wherein the resistive heating body is substantially made of tungsten.

17. The ceramic heater of claim 13, wherein the resistive heating body has a diameter of not more than 2.0 mm.

18. The ceramic heater of claim 9, wherein the block-shaped terminal is fixed to the ceramic substrate by a compression stress exerted on the block-shaped terminal caused by thermal shrinkage of the ceramic substrate after the firing.

19. A semiconductor wafer heating device, comprising a ceramic heater consisting of a ceramic substrate comprising one of an aluminum nitride sintered body and a dense alumina sintered body, said sintered body having a corrosion resistant outer surface film of aluminum trifluoride, a resistive heating body made of a heat-resistant metal embedded in the ceramic substrate, and a plurality of terminals connected to the resistive heating body and exposed to a surface other than a wafer-heating surface of the ceramic substrate; a retaining member arranged in a housing of the heating device for retaining the ceramic heater; an elongated electrode member one end of which is connected to the terminal; a lead wire connected to the other end of the elongated electrode terminal; and a tubular body made of an inorganic insulative material enclosing at least one end of the electrode member, an end of the tubular body being gastightly joined to the ceramic substrate, the tubular body being inserted through a throughhole of the housing, and the housing and the tubular body being gastightly sealed from each other.

20. The semiconductor wafer heating device of claim 17, wherein the tubular body has a flange portion at its end, and the flange portion is joined to the ceramic substrate.

21. The semiconductor wafer heating device of claim 17, wherein the tubular body comprises of an aluminum nitride sintered body.

22. A semiconductor wafer heating device, comprising a ceramic heater consisting of a ceramic substrate comprising one of an aluminum nitride sintered body and a dense alumina sintered body, said sintered body having a corrosion resistant outer surface film of aluminum trifluoride, a resistive heating body made of a heat-resistant metal embedded in the ceramic substrate, and a plurality of terminals connected to the resistive heating body and exposed to a surface other than a wafer heating surface of the ceramic substrate; a retaining member arranged in a housing of the heating device for retaining the ceramic heater; a temperature-measuring device one end of which is inserted in the ceramic substrate; and a tubular body made of an inorganic insulative material enclosing the temperature-measuring device, and an end of the tubular body being joined to the ceramic substrate, the tubular body being inserted through a throughhole of the housing, and the housing and the tubular body being gastightly sealed from each other.

23. The semiconductor wafer heating device of claim 20, wherein the temperature-measuring device consists of a hollow sheath having a thermocouple inserted therein, and the hollow sheath is enclosed by the tubular body.

* * * * *